US012721154B2

(12) United States Patent
Kuo et al.

(10) Patent No.: US 12,721,154 B2
(45) Date of Patent: Aug. 25, 2026

(54) SEMICONDUCTOR STRUCTURE HAVING VERTICLE CONDUCTIVE GRAPHENE AND METHOD FOR FORMING THE SAME

(71) Applicant: TAIWAN SEMICONDUCTOR MANUFACTURING COMPANY, LTD., Hsinchu (TW)

(72) Inventors: Tsu-Chun Kuo, Hsinchu (TW); Shin-Yi Yang, Hsinchu (TW); Yu-Chen Chan, Hsinchu (TW); Shu-Wei Li, Hsinchu (TW); Meng-Pei Lu, Hsinchu (TW); Ming-Han Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/363,515

(22) Filed: Aug. 1, 2023

(65) Prior Publication Data

US 2023/0378067 A1 Nov. 23, 2023

Related U.S. Application Data

(62) Division of application No. 17/460,909, filed on Aug. 30, 2021.

(51) Int. Cl.
*H10W 20/44* (2026.01)
*H10P 14/43* (2026.01)
(Continued)

(52) U.S. Cl.
CPC ......... *H10W 20/4462* (2026.01); *H10P 14/43* (2026.01); *H10W 20/034* (2026.01);
(Continued)

(58) Field of Classification Search
CPC ........... H01L 21/76807; H01L 21/7681; H01L 21/28556; H01L 21/76876;
(Continued)

(56) References Cited

U.S. PATENT DOCUMENTS

2001/0023121 A1* 9/2001 Meijer .............. H01L 21/76843 257/E23.145
2005/0205847 A1 9/2005 Dailly et al.
(Continued)

OTHER PUBLICATIONS

Matsumoto et al., Structure and stability of n- and p-type intercalated multilayer graphene using Cs—C2H4, FeCl3 and MoCl5, Sep. 2019, Materials Today Communications, 20, 100532. (Year: 2019).*
(Continued)

*Primary Examiner* — Sue A Purvis
*Assistant Examiner* — Aneta B Cieslewicz
(74) *Attorney, Agent, or Firm* — Birch, Stewart, Kolasch & Birch, LLP

(57) ABSTRACT

A semiconductor structure includes a substrate, a dielectric layer, and a graphene conductive structure. The dielectric layer is disposed on the substrate, and has an inner lateral surface that is perpendicular to the substrate. The graphene conductive structure is formed in the dielectric layer and has at least one graphene layer extending in a direction parallel to the inner lateral surface of the dielectric layer.

20 Claims, 31 Drawing Sheets

(51) Int. Cl.
*H10W 20/00* (2026.01)
*H10W 20/20* (2026.01)
*H10W 20/41* (2026.01)

(52) U.S. Cl.
CPC ....... *H10W 20/036* (2026.01); *H10W 20/045* (2026.01); *H10W 20/056* (2026.01); *H10W 20/057* (2026.01); *H10W 20/081* (2026.01); *H10W 20/086* (2026.01); *H10W 20/20* (2026.01); *H10W 20/438* (2026.01); *H10W 20/074* (2026.01); *H10W 20/084* (2026.01)

(58) Field of Classification Search
CPC ......... H01L 21/76844; H01L 21/76847; H01L 21/76879; H01L 21/76877; H01L 21/76802; H01L 21/76829; H01L 23/481; H01L 23/53279; H01L 23/482; H01L 23/4825; H01L 23/4827; H01L 23/4828; H01L 23/535; H01L 23/53276; H01L 21/481; H10W 20/40–498; H10W 20/20–233; H10W 20/031–0698; H10W 20/071–098; H10W 70/60–699; H10W 72/00; H10W 72/823; H10P 14/43
See application file for complete search history.

(56) References Cited

U.S. PATENT DOCUMENTS

2010/0206363 A1* 8/2010 Choi .................... C01B 32/182 428/408
2010/0319971 A1* 12/2010 Lin .................. H01L 21/76828 174/258
2011/0006425 A1 1/2011 Wada et al.
2012/0080662 A1* 4/2012 Saito ................ H01L 21/28556 257/29
2014/0061916 A1 3/2014 Saito et al.
2014/0106561 A1 4/2014 Niyogi et al.
2014/0235051 A1 8/2014 Wann et al.
2014/0284798 A1* 9/2014 Miyazaki .......... H01L 23/53276 257/750
2015/0097261 A1 4/2015 Harris
2015/0270225 A1 9/2015 Yang et al.
2016/0086891 A1 3/2016 Miyazaki et al.
2016/0225694 A1 8/2016 Barth et al.
2016/0272500 A1 9/2016 Sato
2017/0188456 A1 6/2017 Cho et al.
2017/0243875 A1 8/2017 Khan
2017/0317010 A1* 11/2017 Lee .................. H01L 21/76804
2019/0096820 A1 3/2019 Liou et al.
2022/0363547 A1* 11/2022 Chien ..................... C01G 3/02

OTHER PUBLICATIONS

Ketsombun et al., "MoCl5 Intercalation for CVD Graphene at Low Temperature using High Chemical Concentration," Conference Paper, Jul. 2019, 3 pages total.
Kinoshita et al., "Highly Conductive and Transparent Large-Area Bilayer Graphene Realized by MoClS Intercalation," Advanced Materials, vol. 29, 1702141, 2017, pp. 1-9.

* cited by examiner

SEMICONDUCTOR STRUCTURE HAVING VERTICLE CONDUCTIVE GRAPHENE AND METHOD FOR FORMING THE SAME

REFERENCE TO RELATED APPLICATION

This application is a divisional application of U.S. patent application Ser. No. 17/460,909, filed on Aug. 30, 2021, the content of which is incorporated herein by reference in its entirety.

BACKGROUND

The semiconductor integrated circuit (IC) industry has over the past decades experienced tremendous advancements and is still experiencing vigorous development. With the dramatic advances in IC design, new generations of ICs have smaller and more complex circuits. Damascene process, such as single damascene or dual damascene, is one of the techniques used for forming BEOL (back-end-of-line) interconnect structures. The interconnect structures play an important role in miniaturization and electrical performance of the new generations of ICs. Thus, the industry pays much attention on development of the interconnect structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
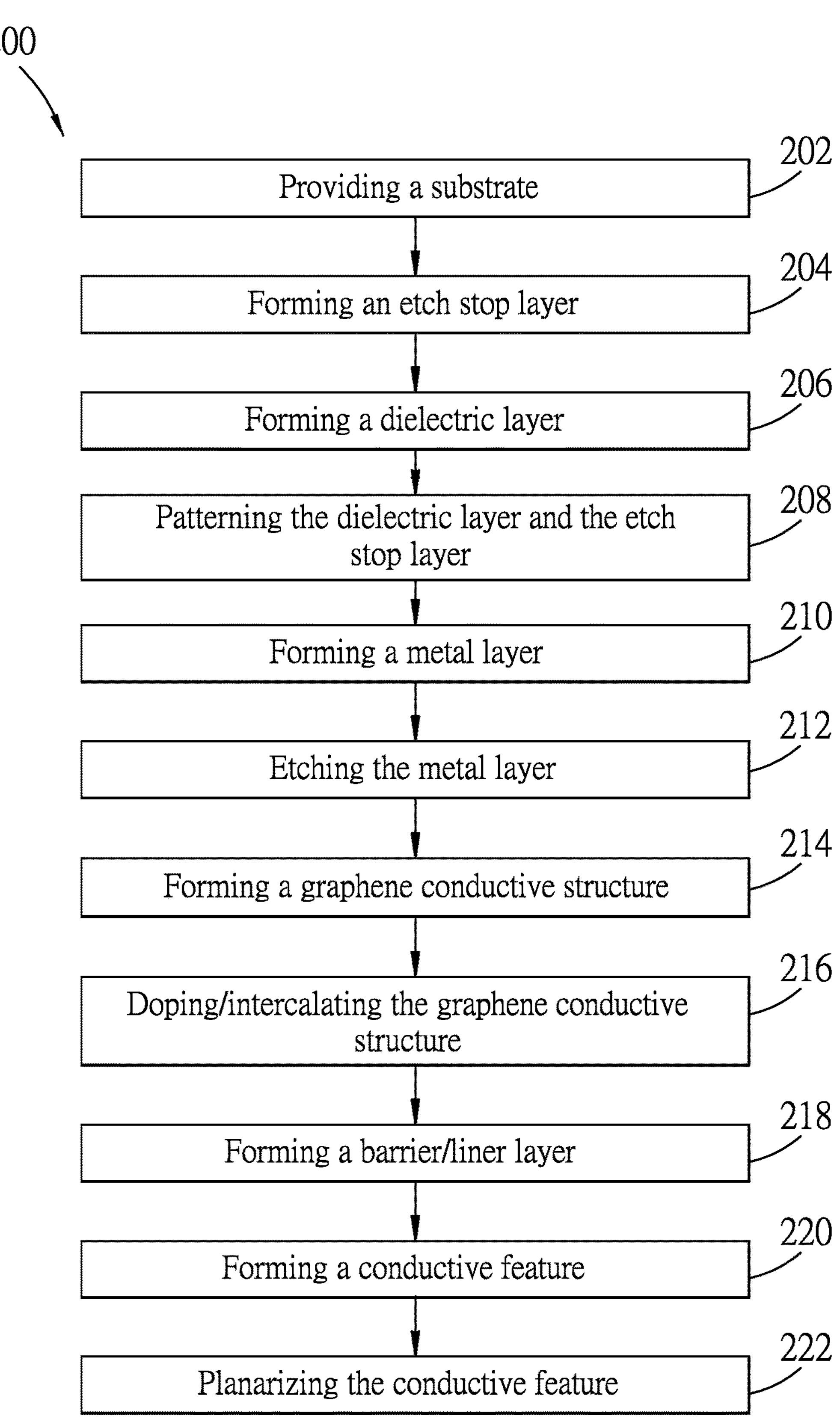
FIG. 1 illustrates a process flow for making a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature' s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 31:
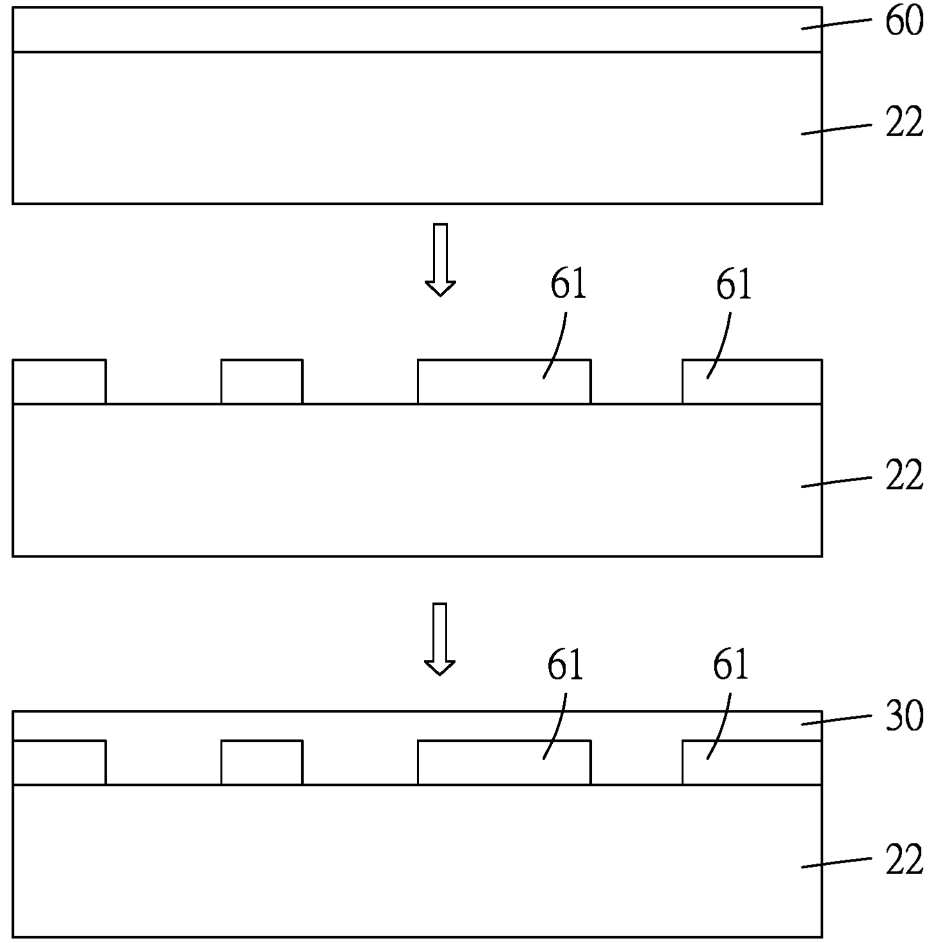
FIG. 31 illustrates a process of making a semiconductor structure in accordance with some embodiments.

In accordance with some embodiments, some ways of forming interconnect patterns involve patterning dielectric layer to define desired interconnect openings (e.g., vias or trenches), followed by filling the interconnect openings using deposition techniques, such as chemical vapor deposition (CVD), atomic layer deposition (ALD), physical vapor deposition (PVD), reflow-PVD, a combination of PVD and electrochemical plating (ECP), or the like. FIG. 31 shows a flow of an alternative way of making a semiconductor structure. Firstly, a horizontal graphene layer 60 is formed on a substrate 22. In some embodiments, the horizontal graphene layer 60 has a stack of graphene sheets (not shown) with each sheet extending in a direction parallel to a top surface of the substrate 22. Then, the horizontal graphene layer 60 is patterned into a plurality of separated graphene portions 61 such that the graphene portions 61 form a pattern. Next, a dielectric layer 30 is deposited to fill gaps between the graphene portions 61 and to cover the graphene portions 61.

FIGS. 2 to 6 illustrate schematic views of intermediate steps in the formation of a semiconductor structure in accordance with some embodiments. The corresponding processes are also reflected in the flow chart 200 as shown in FIG. 1.

Figure 2:
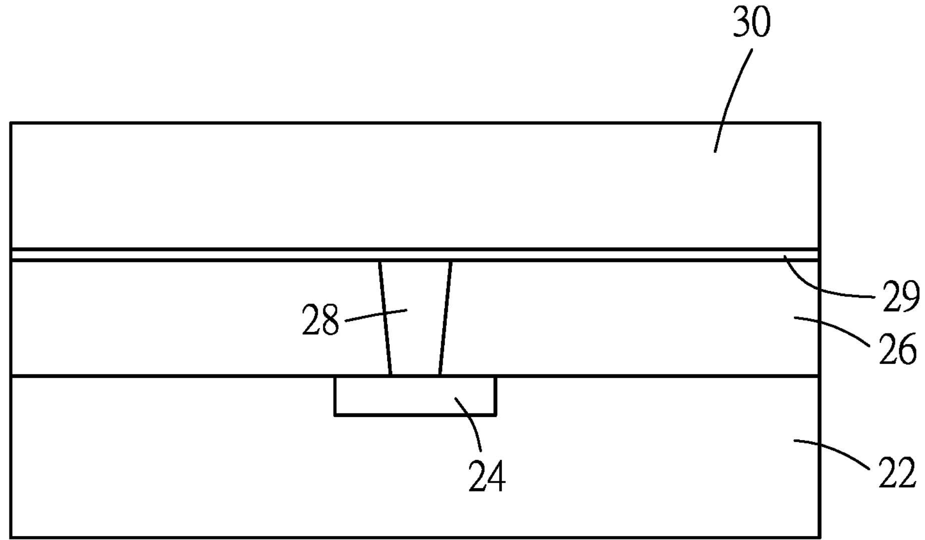
FIGS. 2 through 6 illustrate schematic views of stages in the formation of a semiconductor structure in accordance with some embodiments.

As shown in FIG. 2, a substrate 22 is provided. This process is illustrated as process 202 in the flow chart 200 shown in FIG. 1. In some embodiments, the substrate 22 may be a semiconductor substrate, e.g., an elemental semiconductor or a compound semiconductor. An elemental semiconductor is composed of single species of atoms, such as silicon (Si) or germanium (Ge) in column 14 of the periodic table. A compound semiconductor is composed of two or more elements, such as silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or the like. The compound semiconductor may have a gradient feature in which the composition thereof changes from one ratio at one location to another ratio at another location in the compound semiconductor. The compound semiconductor may be formed over a silicon substrate. The compound semiconductor may be strained. In some embodiments, the substrate 22 may include a multilayer compound semiconductor structure. Alternatively, the substrate 22 may include a non-semiconductor material, such as a glass, fused quartz, or calcium fluoride. Furthermore, in some embodiments, the substrate 22 may be a semiconductor on insulator (SOI) (e.g., silicon germanium on insulator (SGOI)). Generally, an SOI substrate includes a layer of a semiconductor material such as epitaxial silicon (Si), germanium (Ge), silicon germanium (SiGe), or combinations thereof. The substrate 22 may be doped with a p-type dopant, such as boron (Br), aluminum (Al), gallium (Ga), or the like, or may alternatively be doped with an n-type dopant, as is known in the art. In some embodiments, the substrate 22 may include a doped epitaxial layer. Shallow trench isolation (STI) regions (not shown) may be formed in the substrate 22 to isolate active regions (one is schematically shown in FIG. 2 with the numeral 24), such as a source region or a drain region of an integrated circuit device (not shown) in the substrate 22. In some embodiments, the integrated circuit device may include transistors (e.g., field-effect transistors (FETs), complementary metal-oxide semiconductor (CMOS) transistors, planar or vertical multi-gate transistors (e.g., FinFET devices), gate-all-around (GAA) devices, or the like), resistors, capacitors, diodes, interconnections, or the like, based on practical applications. In addition, through-vias (not shown) may be formed to extend into the substrate 22 for electrically connecting features on opposite sides of the substrate 22.

In accordance with some embodiments, a dielectric layer 26 is formed over the substrate 22, and a contact feature 28 is formed in the dielectric layer 26 and is electrically connected to the active region 24.

Subsequent to the provision of the substrate 22, an etch stop layer 29 is formed over the substrate 22. In some embodiments, the etch stop layer 29 is formed on the dielectric layer 26. This process is illustrated as process 204 in the flow chart 200 shown in FIG. 1. In some embodiments, the etch stop layer 29 may be made of a material selected from metal nitride, metal oxide, metal carbide, silicon nitride, silicon oxide, silicon carbide, and combinations thereof. In some embodiments, the metal may be selected from aluminum (Al), zirconium (Zr), yttrium (Y), hafnium (Hf), zinc (Zn), and combinations thereof. In some embodiments, the etch stop layer 29 may be formed by a suitable technique, such as CVD, plasma-enhanced CVD (PECVD), ALD, spin-on coating, electroless plating, or the like.

Subsequent to the formation of the etch stop layer 29, a dielectric layer 30 is formed over the etch stop layer 29. This process is illustrated as process 206 in the flow chart 200 shown in FIG. 1. In accordance with some embodiments, the dielectric layer 30 may be a low-k inter-layer dielectric (LK ILD) layer, such as a pre-metal dielectric (PMD) layer or an inter-metal dielectric (IMD) layer. In some embodiments, the dielectric layer 30 includes undoped silicate glass (USG), phosphosilicate glass (PSG), borosilicate glass (BSG), boron-doped phosphosilicate glass (BPSG), fluorine-doped silicate glass (FSG), silicon dioxide ($SiO_2$), SiOC-based materials, or other suitable extreme low-K (ELK) or ultra low-K (ULK) materials. In some embodiments, silicon dioxide may be formed from tetraethyl orthosilicate (TEOS). In some embodiments, the dielectric layer 30 may be formed using spin coating, CVD (e.g., flowable CVD, PECVD, low pressure chemical vapor deposition (LPCVD), etc.), or the like. In some embodiments, the dielectric layer 30 may include an anti-reflective layer (not shown), such as a nitrogen-free anti-reflective coating (NFARC), for preventing radiation used in a subsequent photolithographic process from reflecting off layers below and interfering with the exposure procedure. The NFARC may include a material such as silicon-rich oxide (SRO), or silicon oxygen carbide (i.e., carbon-doped silicon oxide). The NFARC may be formed by CVD or the like.

Figure 3:
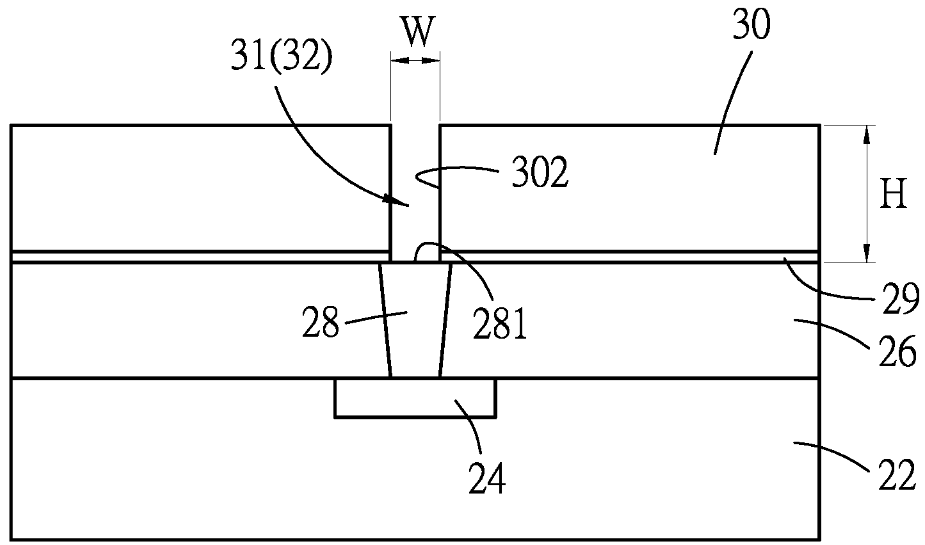

Referring to FIG. 3, after the formation of the dielectric layer 30, the dielectric layer 30 and the etch stop layer 29 are patterned by an etching process to form an interconnect opening 31 in the dielectric layer 30. In some embodiments, a top surface 281 of the contact feature 28 is exposed from the interconnect opening 31. This process is illustrated as process 208 in the flow chart 200 shown in FIG. 1. The etching process may include a dry etching process, which includes forming a patterned mask layer (not shown) such as a patterned photo-resist layer, and then etching the dielectric layer 30 and the etch stop layer 29 using the patterned mask layer as a mask.

In accordance with some embodiments, the interconnect opening 31 is defined by an inner lateral surface 302 of the dielectric layer 30, and is a via 32 which extends through the dielectric layer 30 and the etch stop layer 29 and which may be formed in a single damascene process. An opening of the interconnect opening 31 has a width (W), and the interconnect opening 31 has a height (H). An aspect ratio of the interconnect opening 31 is defined as H/W. In some embodiments, the width (W) of the opening of the interconnect opening 31 ranges from about 1.5 nm to about 15 nm. In some embodiments, the interconnect opening 31 may be made by a single damascene process, and the width (W) of the opening of the interconnect opening 31 ranges from about 4 nm to about 15 nm. In some embodiments, the aspect ratio of the interconnect opening 31 is smaller than about 5.

Figure 4:
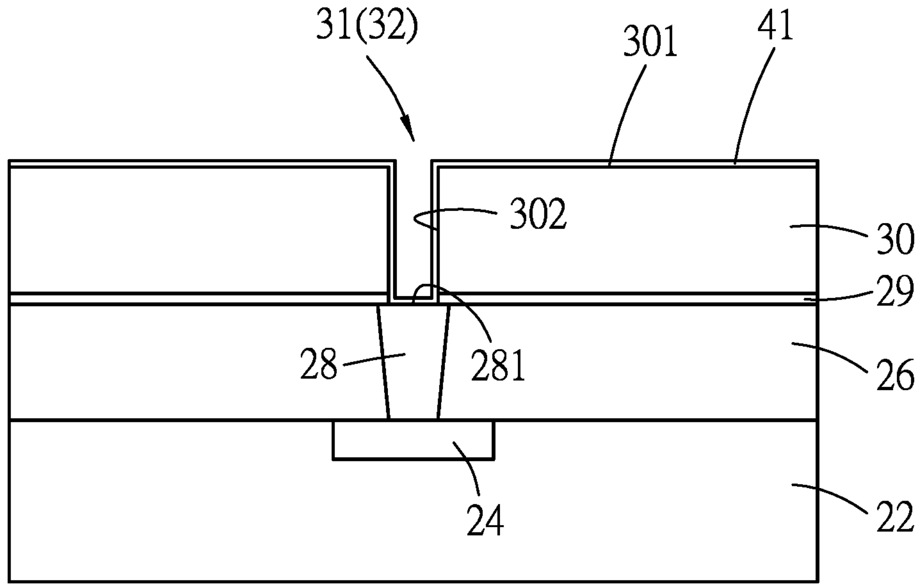

FIG. 4 illustrates the formation of a metal layer 41 on the dielectric layer 30. This process is illustrated as process 210 in the flow chart 200 shown in FIG. 1. In accordance with some embodiments, the metal layer 41 covers a top surface 301 of the dielectric layer 30, the inner lateral surface 302 of the dielectric layer 30, and the top surface 281 of the contact feature 28 exposed from the interconnect opening 31. In some embodiments, the metal layer 41 may be formed by PVD, CVD, ALD, electroless deposition (ELD), or the like. In some embodiments, the metal layer 41 may include Co, Ni, Ru, Rh, Pd, Re, Cu, Ag, Ir, Pt, Au, or combinations thereof. In alternative embodiments, the metal layer 41 may include Ti, Hf, Ta, W, or combinations thereof. In some embodiments, the metal layer 41 may have a thickness ranging from about 0.3 nm to about 2 nm.

Figure 5:
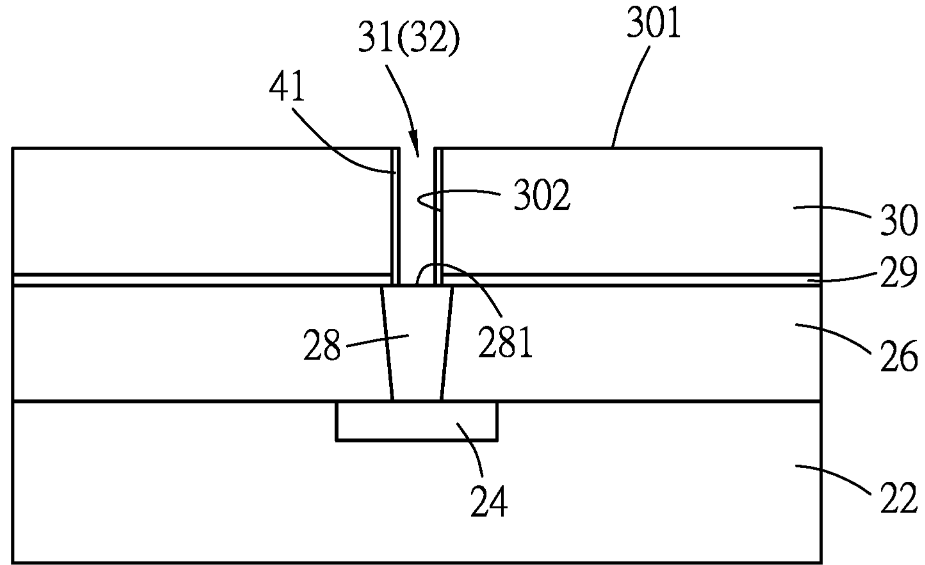

FIG. 5 illustrates a process of etching away a part of the metal layer 41. This process is illustrated as process 212 in the flow chart 200 shown in FIG. 1. In accordance with some embodiments, any portion of the metal layer 41, which is not formed on the inner lateral surface 302 of the dielectric layer 30, is removed. In other words, portions of the metal layer 41 formed on the top surface 301 of the dielectric layer 30 and on the top surface 281 of the contact feature 28 are removed. The metal formed on the inner lateral surface 302 of the dielectric layer 30 is maintained. In some embodiments, the etching process may be conducted using directional dry etching, such as plasma reactive etching, atomic layer etching, ion-beam etching, e-beam etching, plasma physical bombardment, or the like. In some embodiments, the plasma reactive etching may use reaction gases containing $H_2$, $O_2$, $N_2$, $F_2$, $Cl_2$, $C_xF_y$, $NF_3$, $SiF_4$, $SiCl_4$, $BCl_3$, or the like. In some embodiments, the atomic layer etching may use reaction gas containing $F_2$, $Cl_2$, $Br_2$, $H_2$, HF, HCl, $BCl_3$, $CH_3OH$, HCOOH, acetylacetone, hexafluoroacetylacetone, or the like. In some embodiments, the plasma physical bombardment may use reaction gas containing $H_2$, He, Ar, $N_2$, Xe, or the like. The etching process may involve a directional etching directed vertically toward the dielectric layer 30.

Figure 6:
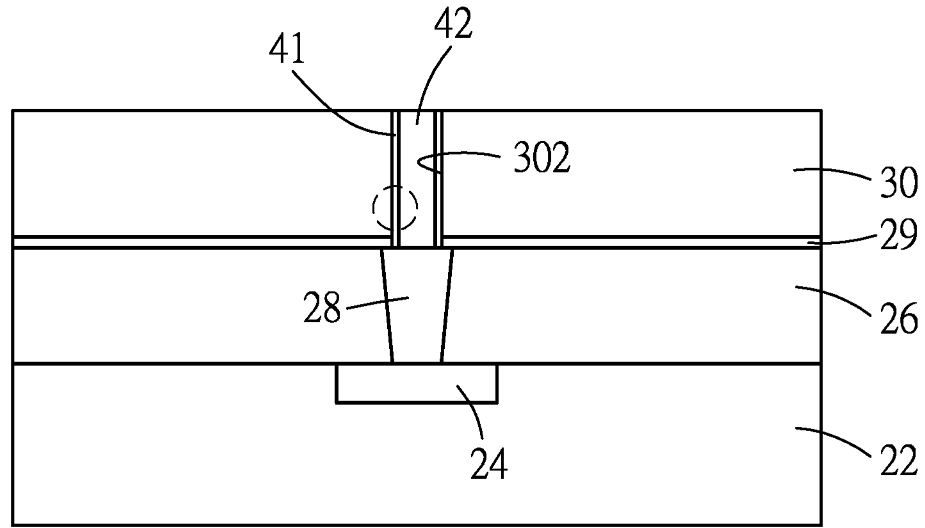

Referring to FIG. 6 with reference to FIG. 5, a process is conducted to form a graphene conductive structure 42 on the metal layer 41 to fill the interconnect opening 31. This process is illustrated as process 214 in the flow chart 200 shown in FIG. 1. In accordance with some embodiments, the graphene conductive structure 42 may be deposited using PECVD with one of radio frequency (RF) plasma, direct current (DC) plasma, inductively coupled plasma (ICP), microwave (MW) plasma, electron cyclotron resonance (ECR) plasma, or the like. In alternative embodiments, the graphene conductive structure 42 may be deposited using thermal CVD. In some embodiments, temperature of the deposition process may range from about room temperature to about 1000° C. In some embodiments, the graphene deposition process is PECVD to allow the deposition to take place at a temperature below about 400° C., thereby minimizing the influence of high temperature on the integrated circuit device in the substrate 22. In some embodiments, precursors for depositing the graphene conductive structure 42 may include CO, $CH_4$, $C_2H_2$, $CF_4$, $C_2F_6$, $CHF_3$, benzene, derivatives thereof, or the like. In some embodiments, the metal layer 41 may serve as a catalyst for the growth of the graphene conductive structure 42.

Figure 7:
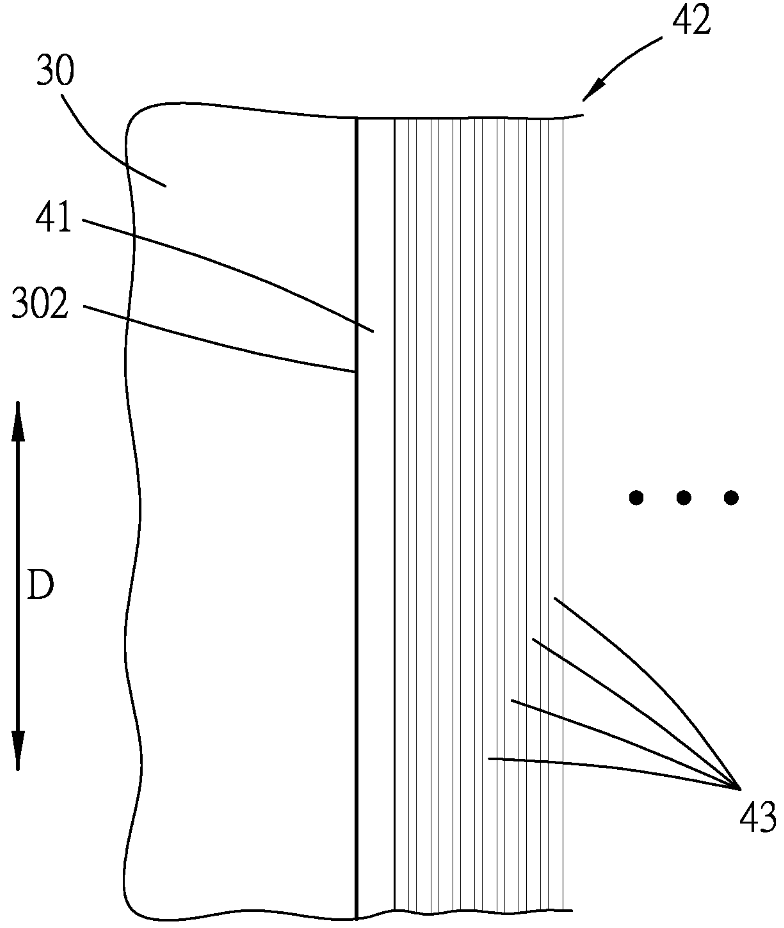
FIG. 7 is a partially enlarged view of the semiconductor structure in accordance with some embodiments, taken from FIG. 6.
Figure 8:
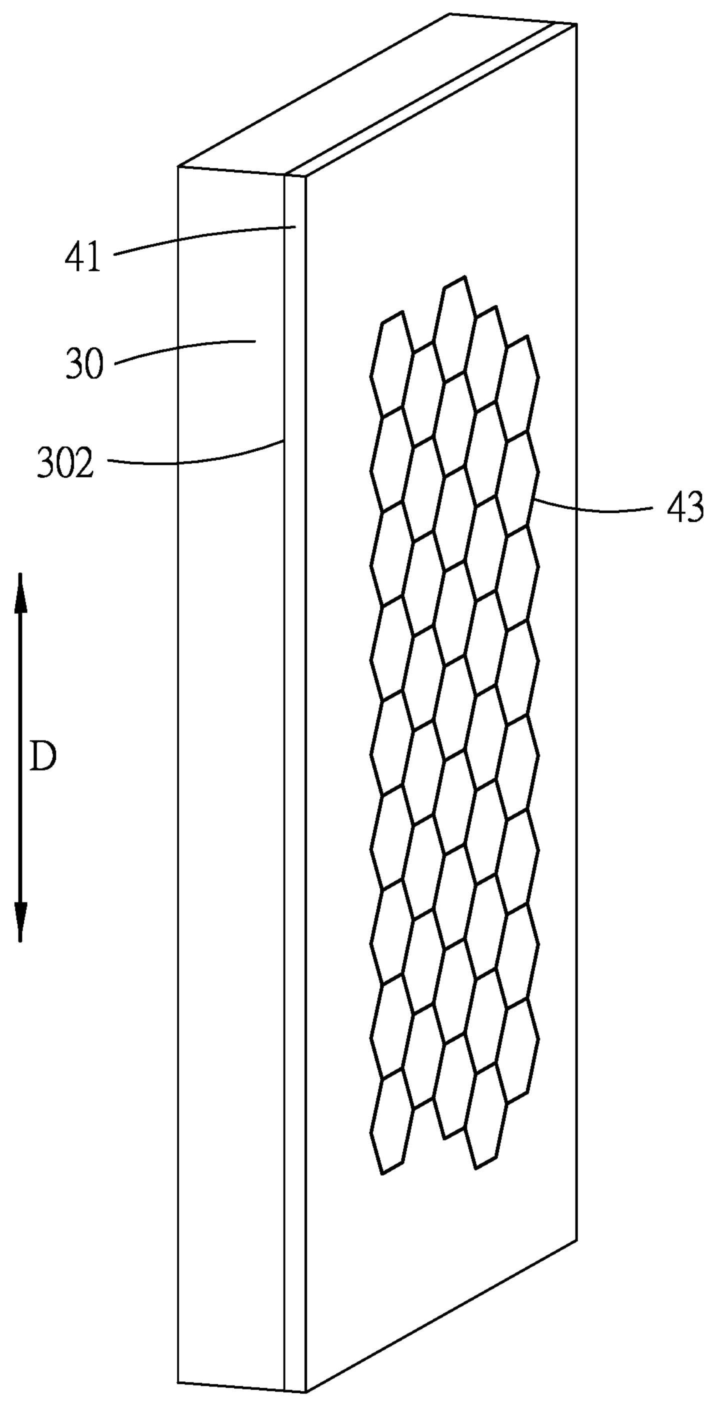
FIG. 8 is a schematic view showing a graphene layer of the semiconductor structure in accordance with some embodiments.

FIG. 7 is a partially enlarged view taken from the dotted circle in FIG. 6. The illustrated part in FIG. 7 includes the dielectric layer 30, the metal layer 41 formed on the inner lateral surface 302 of the dielectric layer 30, and the graphene conductive structure 42. In some embodiments, the graphene conductive structure 42 includes a plurality of graphene layers 43 that are formed on the metal layer 41 in a layer-by-layer manner until the graphene conductive structure 42 completely fills the interconnect opening 31 (see FIG. 5) without leaving voids in the graphene conductive structure 42 as encountered in metal deposition process. Each of the graphene layers 43 extends in a direction (D) (e.g., a vertical direction in some embodiments) parallel to the inner lateral surface 302 of the dielectric layer 30. Each of the graphene layers 43 may be composed of a plurality of carbon atoms arranged in a honeycomb pattern (i.e., hexagons) extending in the direction (D) and parallel to the inner lateral surface 302 of the dielectric layer 30. One graphene layer 43 is schematically shown in FIG. 8, in which the honeycomb carbon layer extends in the direction (D) and parallel to the inner lateral surface 302 of the dielectric layer 30.

Figure 9:
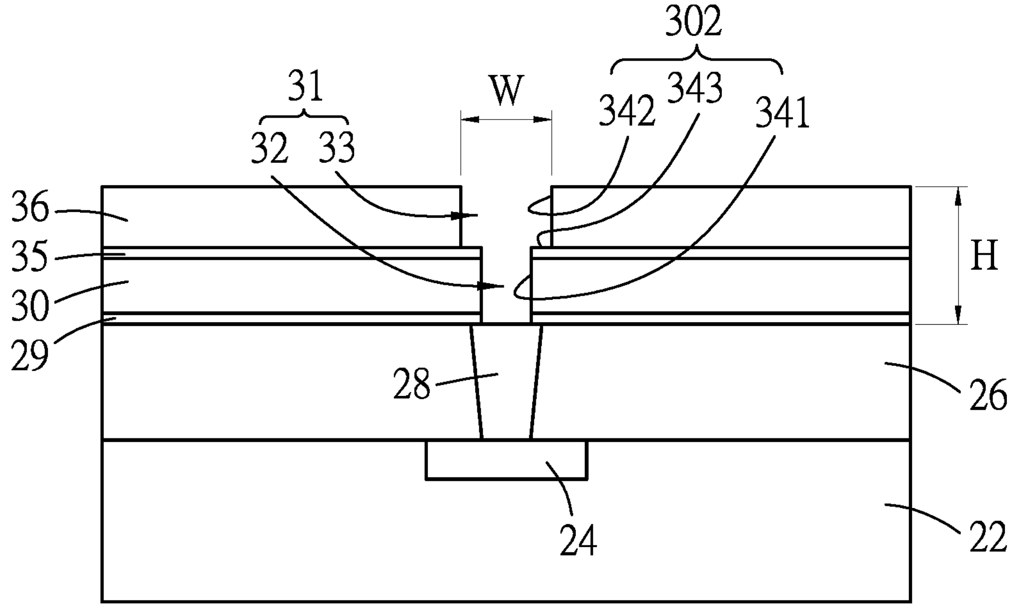
FIGS. 9 through 12 illustrate schematic views of stages in the formation of a semiconductor structure in accordance with some embodiments.

FIG. 9 illustrates an alternative to the structure depicted in FIG. 3 and the processes 204, 206, 208 in the flow chart 200 as shown in FIG. 1. In accordance with some embodiments, another etch stop layer 35 and another dielectric layer 36 may be formed on the dielectric layer 30. The dielectric layer 30 and the etch stop layer 29 are patterned to form the via 32, and then the dielectric layer 36 and the etch stop layer 35 are patterned to form a trench 33. In other words, the interconnect opening 31 includes the via 32, and the trench 33 which is spatially communicated with the via 32 and which has a width larger than that of the via 32. In some embodiments, such combination of the via 32 and the trench 33 may be formed by a dual damascene process or two separate single damascene processes. The via 32 and the trench 33 of the interconnect opening 31 are defined by the inner lateral surface 302. In some embodiments, the inner lateral surface 302 is defined by the dielectric layer 36, the etch stop layer 35, the dielectric layer 30 and the etch stop layer 29. In some embodiments, the inner lateral surface 302 is in a stepped shape, and has a first vertical portion 341 that defines the via 32, a second vertical portion 342 that defines the trench 33, and a horizontal portion 343 that interconnects the first vertical portion 341 and the second vertical portion 342. In some embodiments, the width (W) of the opening of the interconnect opening 31 is defined as the width of the opening of the trench 33, and the height (H) of the interconnect opening 31 is defined as the height of the via 32 and the trench 33 combined. In some embodiments, the width (W) of the opening of the trench 33 ranges from about 1.5 nm to about 15 nm. In some embodiments, the width (W) of the opening of the trench 33 ranges from about 4 nm to about 15 nm. In some embodiments, the aspect ratio (H/W) of the interconnect opening 31 is smaller than about 10.

Figure 10:
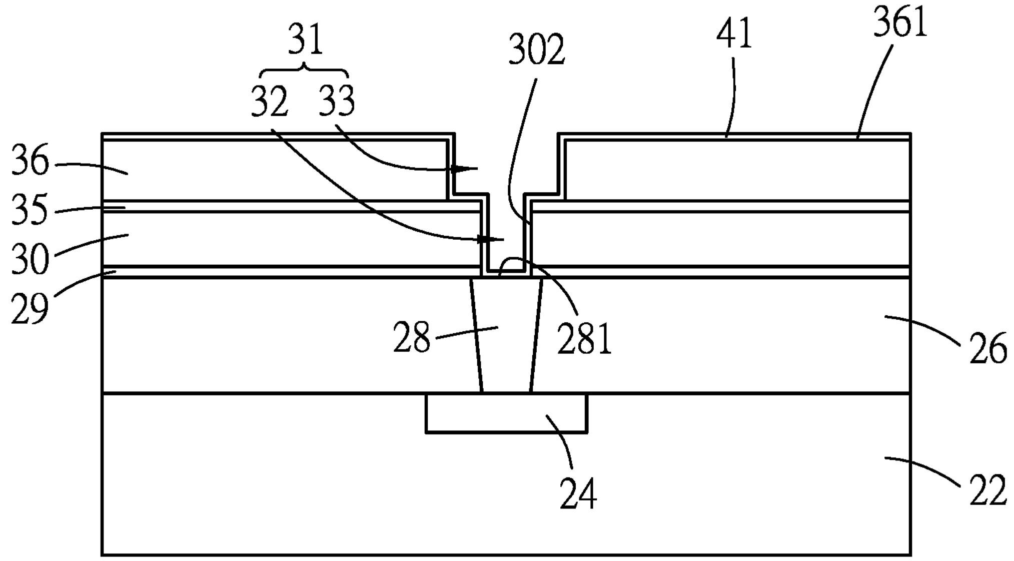

FIG. 10 illustrates an alternative to the structure depicted in FIG. 4 and the process 210 in the flow chart 200 as shown in FIG. 1. In accordance with some embodiments, the metal layer 41 is formed on the dielectric layer 36 and covers a top surface 361 of the dielectric layer 36, the inner lateral surface 302, and the top surface 281 of the contact feature 28 exposed from the via 32 and the trench 33 of the interconnect opening 31. In some embodiments, the metal layer 41 may be formed by PVD, CVD, ALD, ELD, or the like. In some embodiments, the metal layer 41 may include Co, Ni, Ru, Rh, Pd, Re, Cu, Ag, Ir, Pt, Au, or combinations thereof. In alternative embodiments, the metal layer 41 may include Ti, Hf, Ta, W, or combinations thereof. In some embodiments, the metal layer 41 may have a thickness ranging from about 0.3 nm to about 2 nm.

Figure 11:
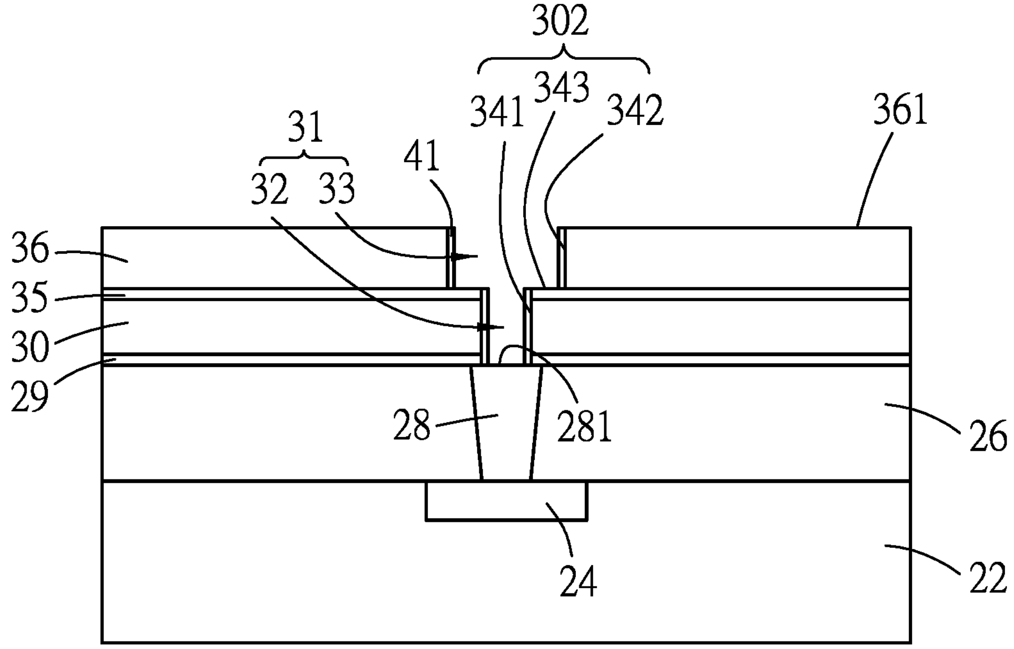

FIG. 11 illustrates an alternative to the structure depicted in FIG. 5 and the process 212 in the flow chart 200 as shown in FIG. 1. In accordance with some embodiments, portions of the metal layer 41 that are formed on the top surface 361 of the dielectric layer 36, on the horizontal portion 343 of the inner lateral surface 302, and on the top surface 281 of the contact feature 28 are removed. Portions of the metal layer 41 that are formed on the first vertical portion 341 and the second vertical portion 342 of the inner lateral surface 302 are maintained. The etching process may be conducted using directional dry etching, such as plasma reactive etching, atomic layer etching, ion-beam etching, e-beam etching, plasma physical bombardment, or the like. In some embodiments, the plasma reactive etching may use reaction gases containing $H_2$, $O_2$, $N_2$, $F_2$, $Cl_2$, $C_xF_y$, $NF_3$, $SiF_4$, $SiCl_4$, $BCl_3$, or the like. In some embodiments, the atomic layer etching may use reaction gas containing $F_2$, $Cl_2$, $Br_2$, $H_2$, HF, HCl, $BCl_3$, $CH_3OH$, HCOOH, acetylacetone, hexafluoroacetylacetone, or the like. In some embodiments, the plasma physical bombardment may use reaction gas containing $H_2$, He, Ar, $N_2$, Xe, or the like. The etching process may involve a directional etching directed vertically toward the dielectric layer 30.

Figure 12:
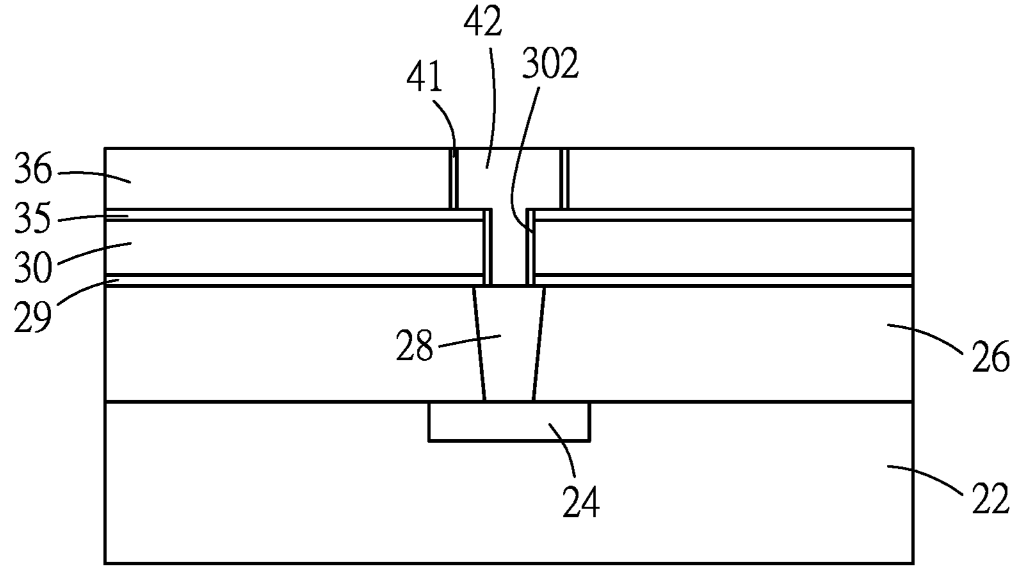

FIG. 12 illustrates an alternative to the structure depicted in FIG. 6, and a process (i.e., the process 214 in the flow chart 200 as shown in FIG. 1) is conducted to form the graphene conductive structure 42 on the metal layer 41 to fill the via 32 and the trench 33 of the interconnect opening 31 (see FIG. 11). In accordance with some embodiments, the graphene conductive structure 42 may be deposited using PECVD with one of RF plasma, DC plasma, ICP, MW plasma, ECR plasma, or the like. In alternative embodiments, the graphene conductive structure 42 may be deposited using thermal CVD. In some embodiments, temperature of the deposition process may range from room temperature to about 1000° C. In some embodiments, the graphene deposition process is plasma-enhanced to allow the deposition to take place at a temperature below about 400° C., thereby minimizing the influence of high temperature on IC devices (not shown) in the substrate 22. In some embodiments, precursors for depositing the graphene conductive structure 42 may include CO, $CH_4$, $C_2H_2$, $CF_4$, $C_2F_6$, $CHF_3$, benzene, derivatives thereof, or the like.

Figure 13:
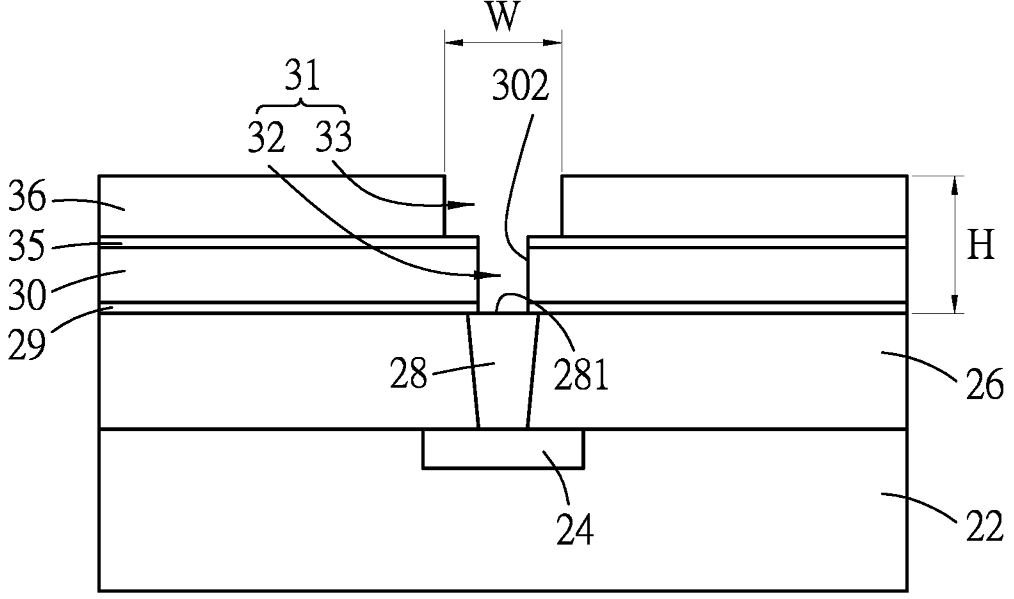
FIGS. 13 through 19 illustrate schematic views of stages in the formation of a semiconductor structure in accordance with some embodiments.

FIG. 13 illustrates an alternative to the structure depicted in FIG. 9 and the process 208 in the flow chart 200 as shown in FIG. 1. In accordance with some embodiments, the dielectric layer 36, the etch stop layer 35, the dielectric layer 30 and the etch stop layer 29 are patterned to form the interconnect opening 31, which includes the via 32 and the trench 33 that is spatially communicated with the via 32 and that has a width larger than that of the via 32. Such combination of the via 32 and the trench 33 may be formed by a dual damascene process or two separate single damascene processes. The via 32 and the trench 33 of the interconnect opening 31 are defined by the inner lateral surface 302. In some embodiments, the width (W) is defined as the width of the opening of the trench 33, and the height (H) is defined as the height of the via 32 and the trench 33 combined. In some embodiments, the width (W) of the opening of the trench 33 is larger than about 15 nm. In some embodiments, the aspect ratio (H/W) of the interconnect opening 31 is smaller than about 10.

Figure 14:
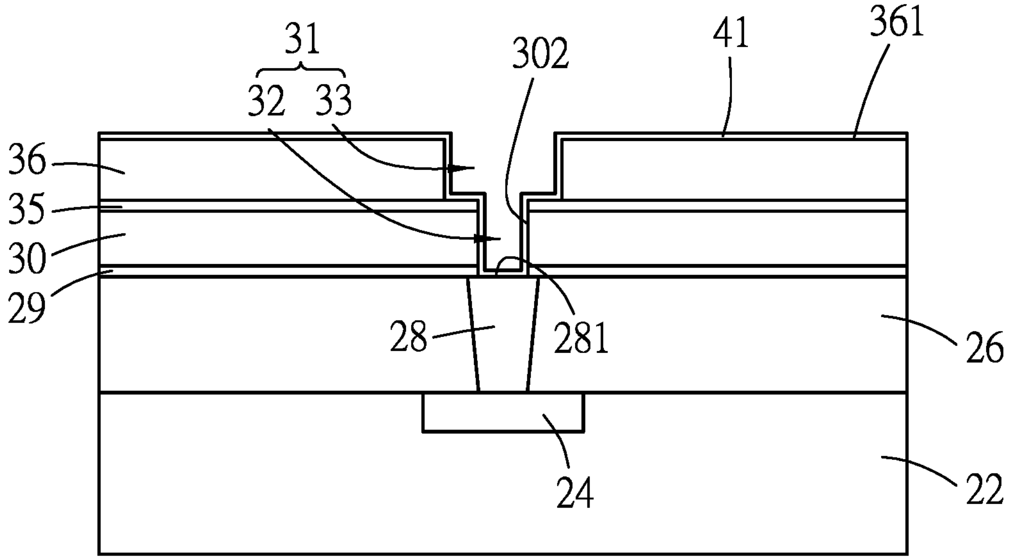

FIG. 14 illustrates an alternative to the structure depicted in FIG. 10 and the process 210 in the flow chart 200 as shown in FIG. 1. In accordance with some embodiments, the metal layer 41 is formed on the dielectric layer 36 and covers the top surface 361 of the dielectric layer 36, the inner lateral surface 302, and the top surface 281 of the contact feature 28 exposed from the via 32 and the trench 33 of the interconnect opening 31. In some embodiments, the metal layer 41 may be formed by PVD, CVD, ALD, ELD, or the like. In some embodiments, the metal layer 41 may include Co, Ni, Ru, Rh, Pd, Re, Cu, Ag, Ir, Pt, Au, or combinations thereof. In alternative embodiments, the metal layer 41 may include Ti, Hf, Ta, W, or combinations thereof. In some embodiments, the metal layer 41 may have a thickness ranging from about 0.3 to about 2 nm.

Figure 15:
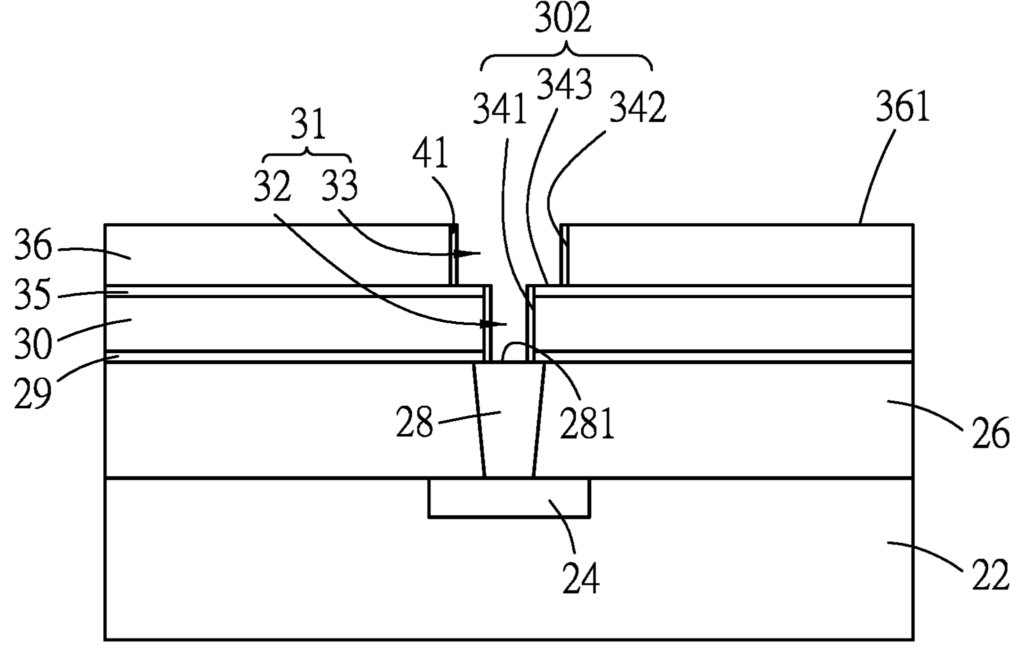

FIG. 15 illustrates an alternative to the structure depicted in FIG. 11 and the process 212 in the flow chart 200 as shown in FIG. 1. In accordance with some embodiments, portions of the metal layer 41 that are formed on the top surface 361 of the dielectric layer 36, on the horizontal portion 343 of the inner lateral surface 302, and on the top surface 281 of the contact feature 28 exposed from the via 32 and the trench 33 of the interconnect opening 31 are removed. Portions of the metal layer 41 that are formed on the first vertical portion 341 and the second vertical portion 342 of the inner lateral surface 302 remain. The etching process may be conducted using directional dry etching, such as plasma reactive etching, atomic layer etching, ion-beam etching, e-beam etching, plasma physical bombardment, or the like. In some embodiments, the plasma reactive etching may use reaction gases containing $H_2$, $O_2$, $N_2$, $F_2$, $Cl_2$, $C_xF_y$, $NF_3$, $SiF_4$, $SiCl_4$, $BCl_3$, or the like. In some embodiments, the atomic layer etching may use reaction gas containing $F_2$, $Cl_2$, $Br_2$, $H_2$, HF, HCl, $BCl_3$, $CH_3OH$, HCOOH, acetylacetone, hexafluoroacetylacetone, or the like. In some embodiments, the plasma physical bombardment may use reaction gas containing $H_2$, He, Ar, $N_2$, Xe, or the like. The etching process may involve a directional etching directed vertically toward the dielectric layer 30.

Figure 16:
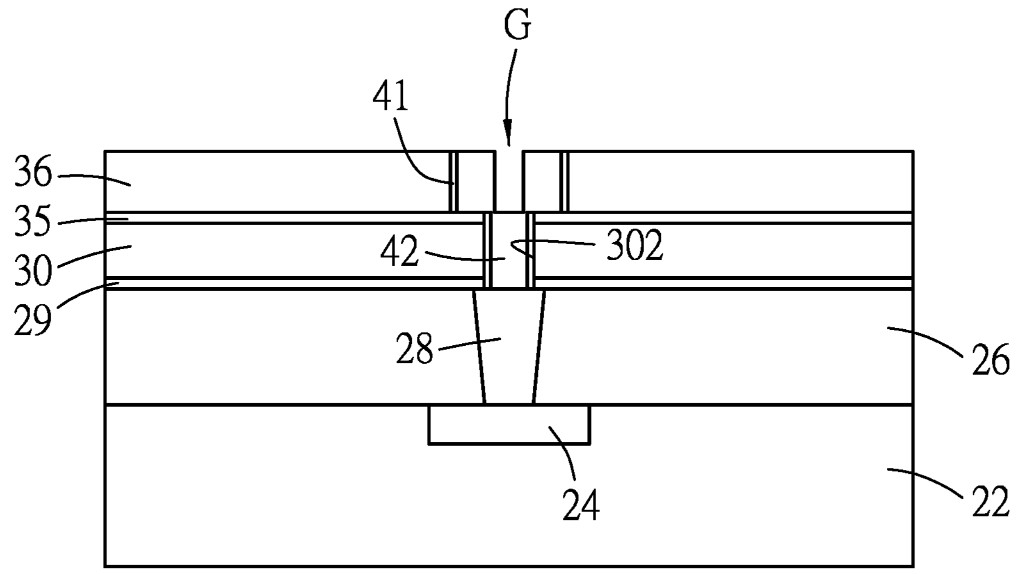

FIG. 16 illustrates an alternative to the structure depicted in FIG. 12 and the process 214 in the flow chart 200 as shown in FIG. 1. In some embodiments, the process 214 is conducted to form the graphene conductive structure 42 on the metal layer 41, in which the via 32 (see FIG. 15) is completely filled with the graphene conductive structure 42 and the trench 33 (see FIG. 15) is partially filled with the graphene conductive structure 42, leaving a gap (G) in the graphene conductive structure 42. In accordance with some embodiments, the graphene conductive structure 42 may be deposited using PECVD with one of RF plasma, DC plasma, ICP, MW plasma, ECR plasma, or the like. In alternative embodiments, the graphene conductive structure 42 may be deposited using thermal CVD. In some embodiments, temperature of the deposition process may range from about room temperature to about 1000° C. In some embodiments, the graphene deposition process is plasma-enhanced to allow the deposition to take place at a temperature below about 400° C., thereby minimizing the influence of high temperature on IC devices (not shown) in the substrate 22. In some embodiments, precursors for depositing the graphene conductive structure 42 may include CO, $CH_4$, $C_2H_2$, $CF_4$, $C_2F_6$, $CHF_3$, benzene, derivatives thereof, or the like.

Figure 20:
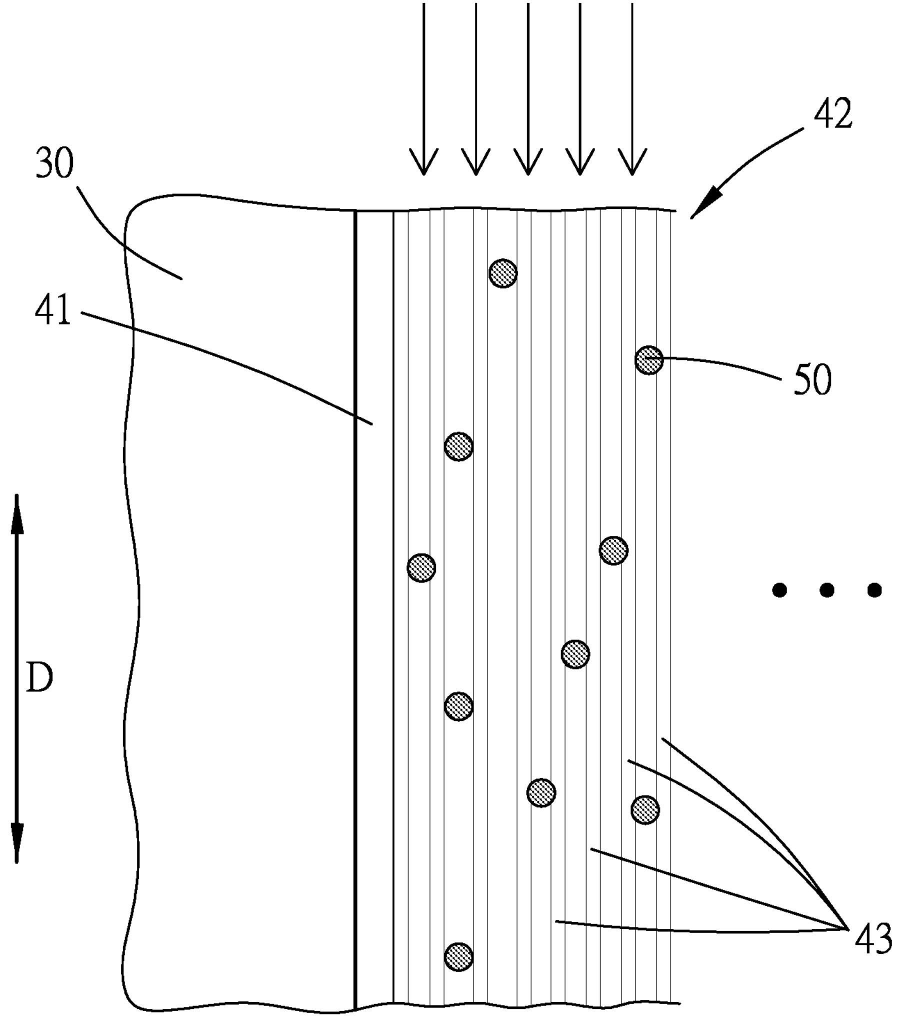
FIG. 20 is a schematic view illustrating doping/intercalation of a semiconductor structure in accordance with some embodiments.

In accordance with some embodiments, as schematically illustrated in FIG. 20, an intercalating material 50 may be doped or intercalated into the graphene conductive structure 42, such that the electrical conductivity of the graphene conductive structure 42 may be enhanced. This process is illustrated as process 216 in the flow chart 200 shown in FIG. 1. The doping or intercalation process may include vapor phase diffusion, CVD, PECVD, liquid phase immersion, implantation, or the like. Some examples of the intercalating material 50 may include Tetraethylenepentamine (TEPA), Diethylenetriamine (DETA), o-Phenylenediamine (OPD), 1,2,4-Triazole, Tetraethylene glycol (TEG), Phenol, Catechol, Trifluorobenzene, Hexafluorobenzene (HFB), or the like. Alternatively, the intercalating material 50 may be, but not limited to, $FeCl_3$, $MoCl_5$, $AuCl_3$, $AlCl_3$, $AsF_5$, $SbF_5$, $HNO_3$, $CuCl_2$, $SbCl_5$, $AuCl_5$, $NiCl_2$, Cs—$C_2H_4$, $NH_3$, ZnMg, $Br_2$, $Cl_2$, $H_2SO_4$, their derivatives, or the like. In some embodiments, the intercalating material 50 may include metal, such as Li, K, Cs, Na, or the like, or their ions. In some embodiments, the intercalating material 50 may include polymer or oligomer, such as Polymethyl methacrylate (PMMA), polystyrene (PS), polycaprolactam (PA6), or the like. In some embodiments, the doping/intercalating process is conducted at a temperature below about 400° C. In some embodiments, the doping/intercalating direction of the intercalating material 50 is substantially parallel to the extending direction (D) of the graphene layers 43 of the graphene conductive structure 42, thereby allowing the intercalating material 50 to be effectively doped or intercalated into the graphene conductive structure 42.

Figure 17:
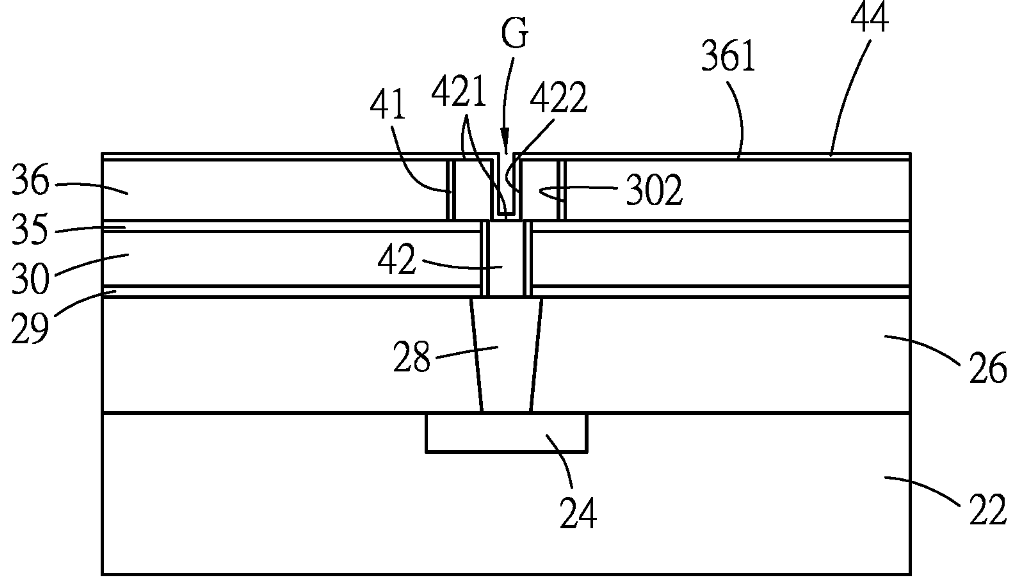

FIG. 17 illustrates a process of forming a barrier/liner layer 44 over the dielectric layer 36. This process is illustrated as process 218 in the flow chart 200 as shown in FIG. 1. In some embodiments, the barrier/liner layer 44 covers the top surface 361 of the dielectric layer 36, top surfaces 421 of the graphene conductive structure 42, and an inner surface 422 of the graphene conductive structure 42 that defines the gap (G). In some embodiments, the barrier/liner layer 44 includes barrier and liner. In some embodiments, the barrier of the barrier/liner layer 44 includes TaN, TiN, Ru, MnN, ZnO, MoN, or the like. In some embodiments, the liner of the barrier/liner layer 44 includes Ta, Ti, Co, Ru, or the like. In some embodiments, the barrier of the barrier/liner layer 44 may serve to prevent metal diffusion and exudation of the metal structure formed in later steps. In some embodiments, the liner of the barrier/liner layer 44 may serve to enhance adhesion of the metal structure formed in later steps to the barrier of the barrier/liner layer 44. In some embodiment, one of the liner and the barrier may be dispensed with. In some embodiments, the barrier/liner layer 44 may be dispensed with.

Figure 18:
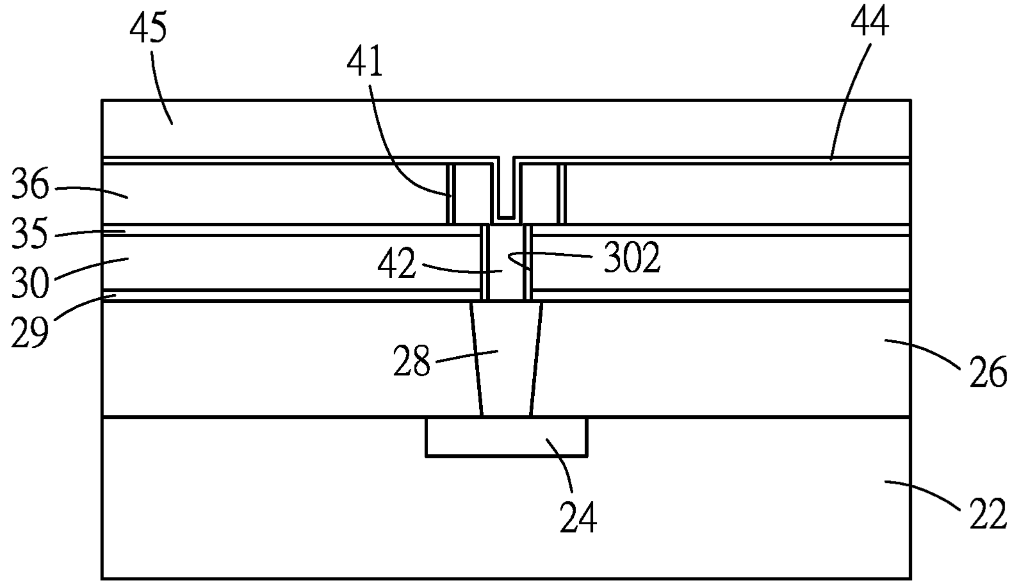

FIG. 18 illustrates a process of forming a conductive feature 45 over the barrier/liner layer 44 to fill the gap (G) (see FIG. 17). This process is illustrated as process 220 in the flow chart 200 shown in FIG. 1. The conductive feature 45 may be made of Cu, Co, W, Ru, Mo, Al, or the like, and may be formed by PVD, reflow PVD, CVD, ALD, ELD, a combination of PVD and ECP, or the like. In some embodiments in which the barrier/liner layer 44 is omitted, the conductive feature 45 is directly formed over the dielectric layer 36 to fill the gap (G).

Figure 19:
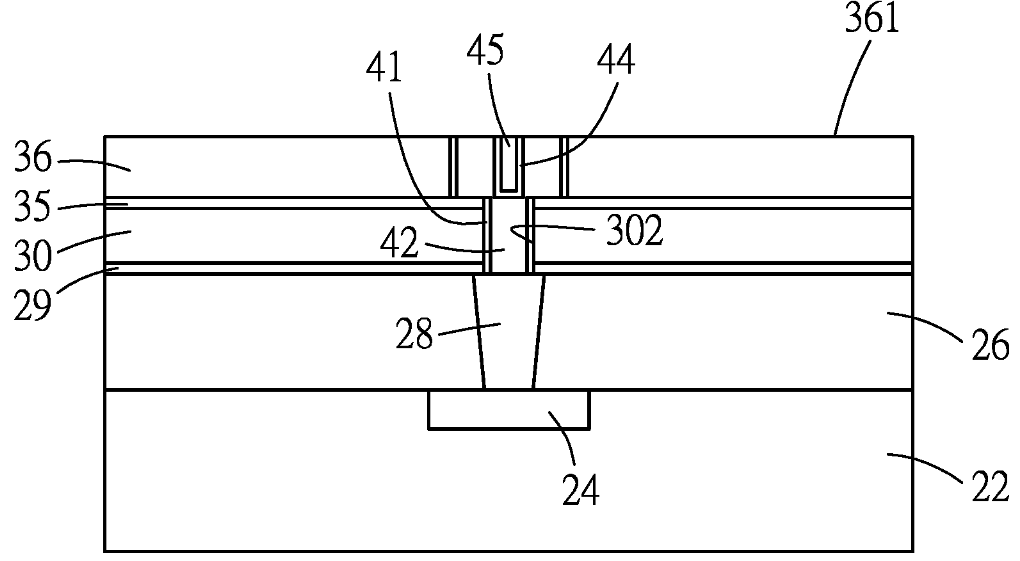

FIG. 19 illustrate a planarization process (e.g., chemical mechanical polish (CMP)) being adopted to remove portions of the conductive feature 45 in excess, so as to form the conductive feature 45 filling the gap (G) (see FIG. 17), thereby completely filling the via 32 (see FIG. 15) with the graphene conductive structure 42 and completely filling the trench 33 (see FIG. 15) with the graphene conductive structure 42 and the conductive feature 45. This process is illustrated as process 222 in the flow chart 200 shown in FIG. 1. In some embodiments, the graphene conductive structure 42 may be doped or intercalated in process 216 in such a manner that electrical conductivity of the graphene conductive structure 42 matches (e.g., substantially equals) that of the conductive feature 45.

Figure 21:
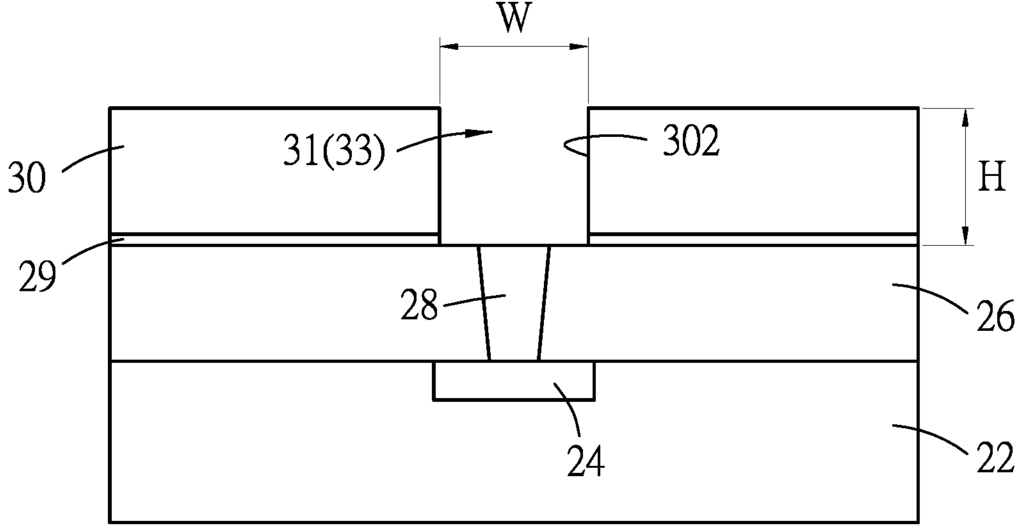
FIGS. 21 through 27 illustrate schematic views of stages in the formation of a semiconductor structure in accordance with some embodiments.

FIG. 21 illustrates an alternative to the structure depicted in FIG. 13 and the process 208 in the flow chart 200 as shown in FIG. 1. In accordance with some embodiments, the dielectric layer 30 and the etch stop layer 29 are patterned (e.g., in a single damascene process) to form the interconnect opening 31 which includes the trench 33 that is defined by the inner lateral surface 302 of the dielectric layer 30. In some embodiments, the width (W) is defined as the width of the opening of the trench 33, and the height (H) is defined as the height of the trench 33. In some embodiments, the width (W) of the opening of the trench 33 is larger than about 15 nm. In some embodiments, the aspect ratio (H/W) of the interconnect opening 31 is smaller than about 5.

Figure 22:
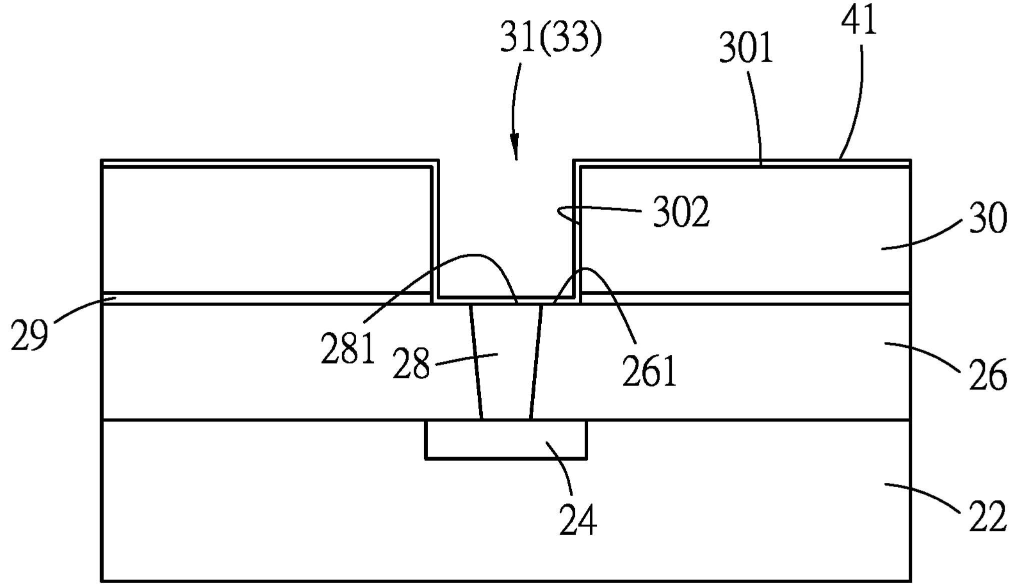

FIG. 22 illustrates an alternative to the structure depicted in FIG. 14 and the process 210 in the flow chart 200 as shown in FIG. 1. In accordance with some embodiments, the metal layer 41 is formed on the dielectric layer 30, and covers the top surface 301 of the dielectric layer 30, the inner lateral surface 302 of the dielectric layer 30, the top surface 281 of the contact feature 28, and a top surface 261 of the dielectric layer 26 exposed from the trench 33. In some embodiments, the metal layer 41 may be formed by PVD, CVD, ALD, ELD, or the like. In some embodiments, the metal layer 41 may include Co, Ni, Ru, Rh, Pd, Re, Cu, Ag, Ir, Pt, Au, or combinations thereof. In alternative embodiments, the metal layer 41 may include Ti, Hf, Ta, W, or combinations thereof. In some embodiments, the metal layer 41 may have a thickness ranging from about 0.3 nm to about 2 nm.

Figure 23:
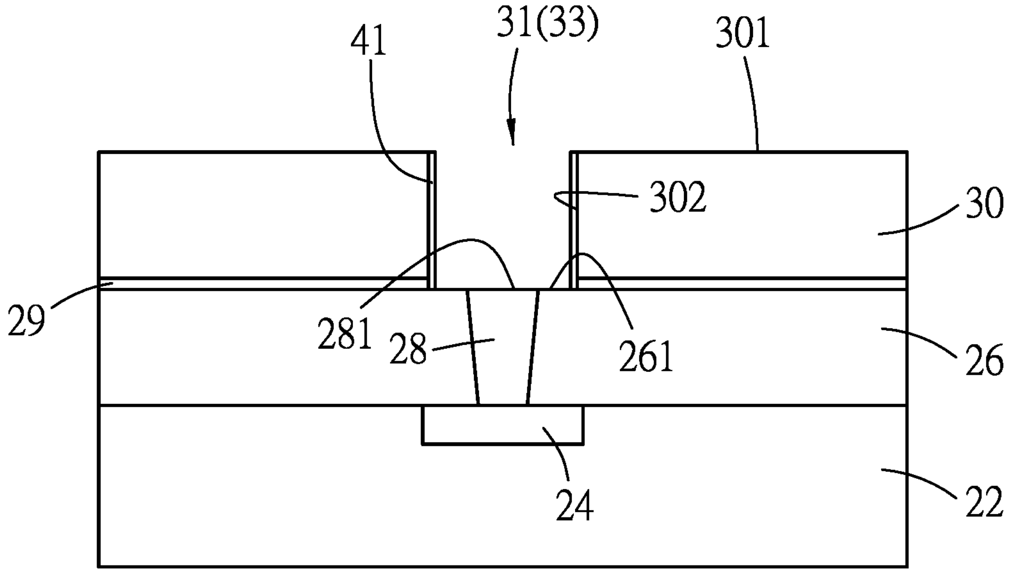

FIG. 23 illustrates an alternative to the structure depicted in FIG. 15 and the process 212 in the flow chart 200 as shown in FIG. 1. In accordance with some embodiments, any portion of the metal layer 41 which is not formed on the inner lateral surface 302 of the dielectric layer 30 is removed. In other words, portions of the metal layer 41 formed on the top surface 301 of the dielectric layer 30, on the top surface 281 of the contact feature 28 and on the top surface 261 of the dielectric layer 26 exposed from the trench 33 are removed. A portion of the metal layer 41 which is formed on the inner lateral surface 302 of the dielectric layer 30 remains. The etching process may be conducted using directional dry etching, such as plasma reactive etching, atomic layer etching, ion-beam etching, e-beam etching, plasma physical bombardment, or the like. In some embodiments, the plasma reactive etching may use reaction gases containing $H_2$, $O_2$, $N_2$, $F_2$, $Cl_2$, $C_xF_y$, $NF_3$, $SiF_4$, $SiCl_4$, $BCl_3$, or the like. In some embodiments, the atomic layer etching may use reaction gas containing $F_2$, $Cl_2$, $Br_2$, $H_2$, HF, HCl, $BCl_3$, $CH_3OH$, HCOOH, acetylacetone, hexafluoroacetylacetone, or the like. In some embodiments, the plasma physical bombardment may use reaction gas containing $H_2$, He, Ar, $N_2$, Xe, or the like. The etching process may involve a directional etching directed vertically toward the dielectric layer 30.

Figure 24:
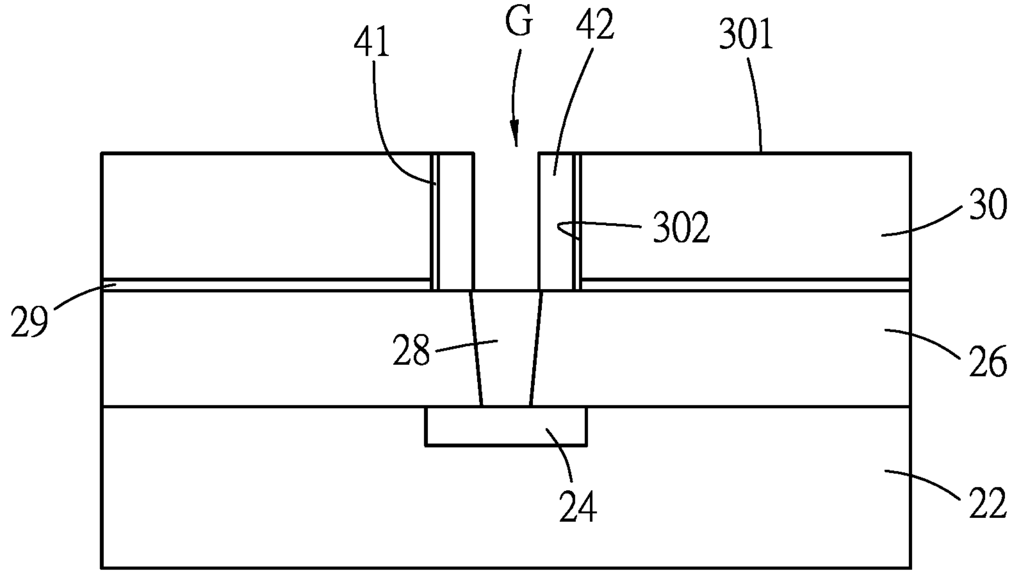

FIG. 24 illustrates an alternative to the structure depicted in FIG. 16 and the process 212 in the flow chart 200 as shown in FIG. 1. Is some embodiments, the process 214 is conducted to form the graphene conductive structure 42 on the metal layer 41, in which the trench 33 (see FIG. 23) is partially filled with the graphene conductive structure 42, leaving the gap (G) in the graphene conductive structure 42. In accordance with some embodiments, the graphene conductive structure 42 may be deposited using PECVD with one of RF plasma, DC plasma, ICP, MW plasma, ECR plasma, or the like. In alternative embodiments, the graphene conductive structure 42 may be deposited using thermal CVD. In some embodiments, temperature of the deposition process may range from about room temperature to about 1000° C. In some embodiments, the graphene deposition process is plasma-enhanced to allow the deposition to take place at a temperature below about 400° C., thereby minimizing the influence of high temperature on IC devices (not shown) in the substrate 22. In some embodiments, precursors for depositing the graphene conductive structure 42 may include CO, $CH_4$, $C_2H_2$, $CF_4$, $C_2F_6$, $CHF_3$, benzene, derivatives thereof, or the like.

Figure 25:
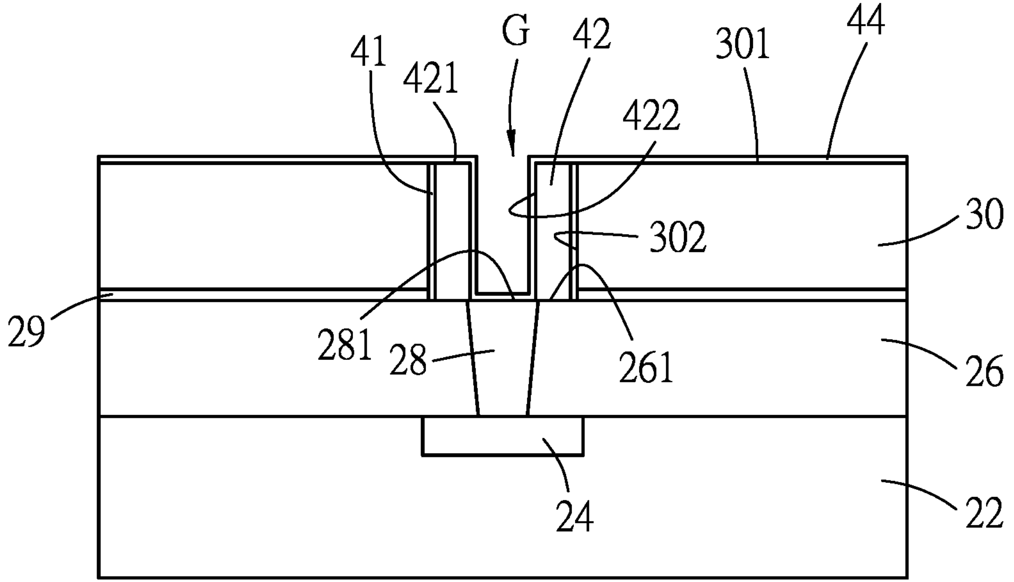

FIG. 25 illustrates an alternative to the structure depicted in FIG. 17 and the process 218 in the flow chart 200 as shown in FIG. 1. In some embodiments, the barrier/liner layer 44 covers the top surface 301 of the dielectric layer 30, the top surface 421 of the graphene conductive structure 42, the inner surface 422 of the graphene conductive structure 42, and the top surface 281 of the contact feature 28. In some embodiments, the top surface 261 of the dielectric layer 26 is not completely covered by the graphene conductive structure 42, and is covered by the barrier/liner layer 44. In some embodiments, the barrier/liner layer 44 includes barrier and liner. In some embodiments, the barrier of the barrier/liner layer 44 includes TaN, TiN, Ru, MnN, ZnO, MoN, or the like. In some embodiments, the liner of the barrier/liner layer 44 includes Ta, Ti, Co, Ru, or the like. In some embodiments, the barrier of the barrier/liner layer 44 may serve to prevent metal diffusion and exudation of the metal structure formed in later steps. In some embodiments, the liner of the barrier/liner layer 44 may serve to enhance adhesion of the metal structure formed in later steps to the barrier of the barrier/liner layer 44. In some embodiment, one of the liner and the barrier may be dispensed with. In some embodiments, the barrier/liner layer 44 may be dispensed with.

Figure 26:
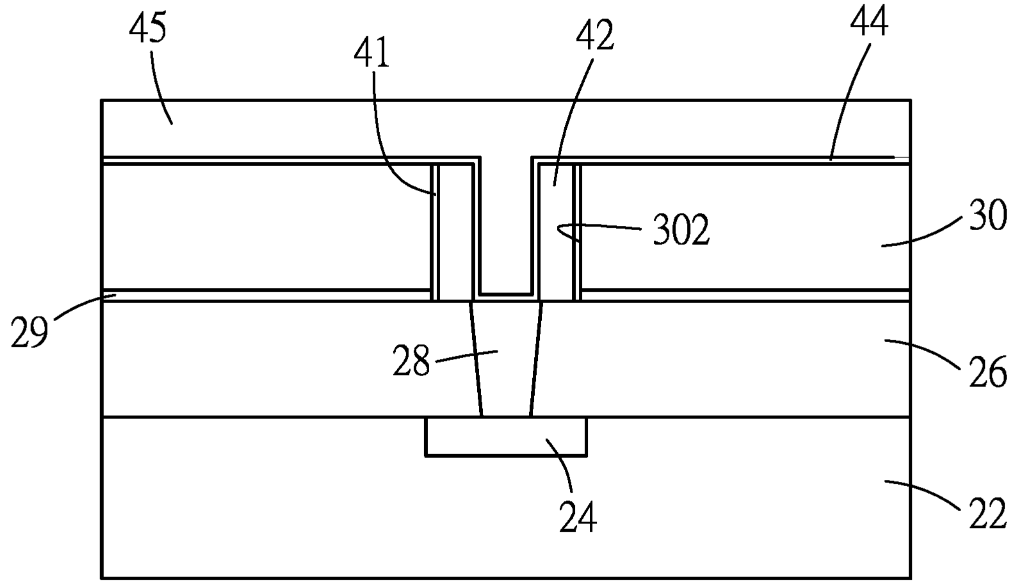

FIG. 26 illustrates an alternative to the structure depicted in FIG. 18 and the process 220 in the flow chart 200 as shown in FIG. 1. In some embodiments, the conductive feature 45 is formed over the barrier/liner layer 44 and fills the gap (G) (see FIG. 25). The conductive feature 45 may be made of Cu, Co, W, Ru, Mo, Al, or the like, and may be formed by PVD, reflow PVD, a combination of PVD and ECP, CVD, ALD, ELD, or the like. In some embodiments in which the barrier/liner layer 44 is omitted, the conductive feature 45 is directly formed over the dielectric layer 30 to fill the gap (G).

Figure 27:
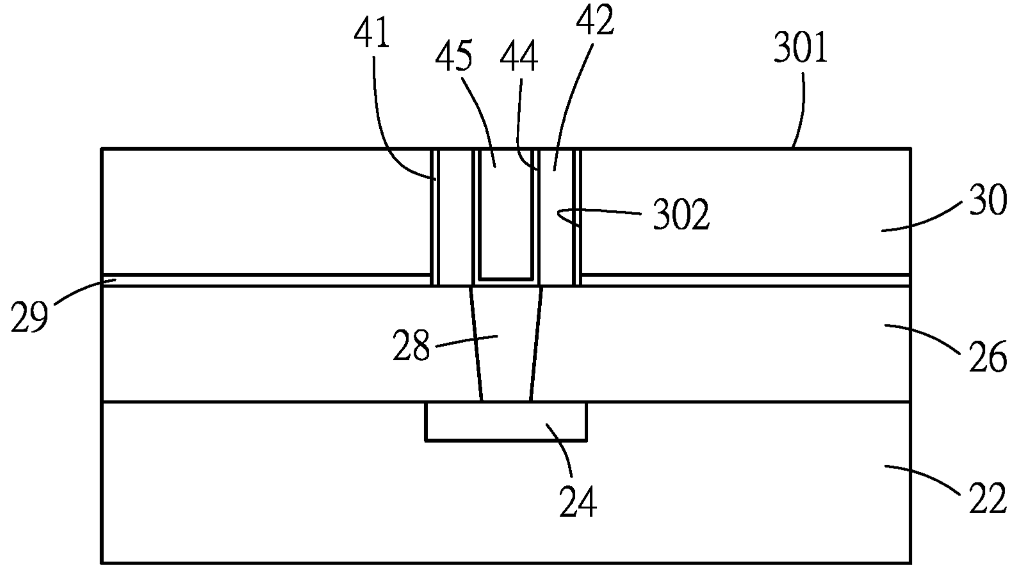

FIG. 27 illustrates an alternative to the structure depicted in FIG. 19 and the process 222 in the flow chart 200 as shown in FIG. 1. In some embodiments, the planarization process (e.g., CMP) is adopted to remove portions of the conductive feature 45 in excess, so as to form the conductive feature 45 filling the gap (G) (see FIG. 25), thereby completely filling the trench 33 (see FIG. 23) with the graphene conductive structure 42 and the conductive feature 45.

In accordance with some embodiments, the semiconductor structure illustrated in FIG. 24 may be subjected to the doping/intercalating process (as illustrated in FIG. 20) to increase electrical conductivity of the graphene conductive structure 42. In some embodiments, the graphene conductive structure 42 may be doped or intercalated such that electrical conductivity of the graphene conductive structure 42 matches (e.g., substantially equals) that of the conductive feature 45. With reference to FIGS. 20 and 24, in some embodiments, the doping/intercalating direction of the intercalating material 50 is substantially parallel to the extending direction (D) of the graphene layers 43 of the graphene conductive structure 42, thereby allowing the intercalating material 50 to be effectively doped or intercalated into the graphene conductive structure 42.

Figure 28:
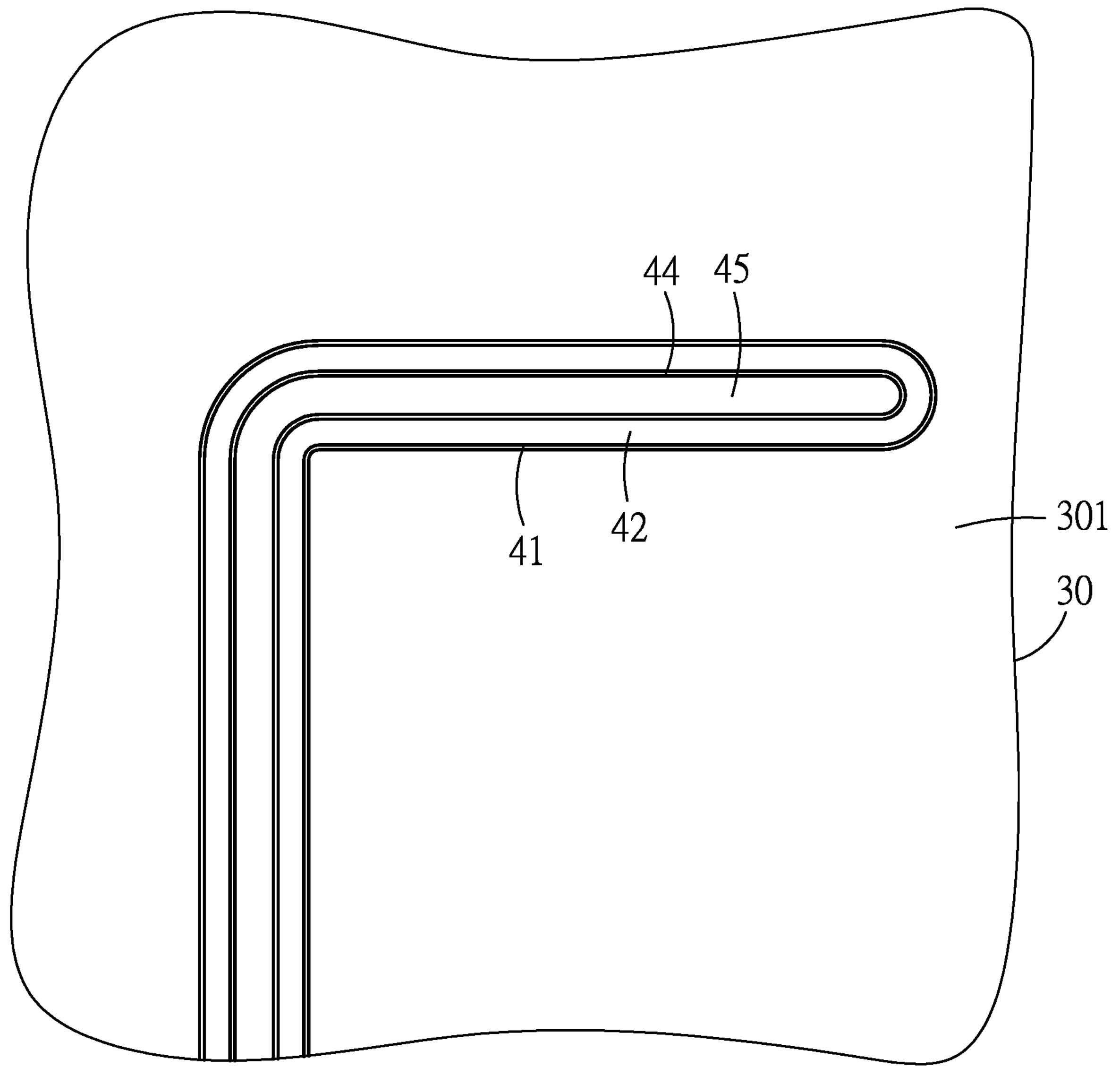
FIG. 28 is a top view of the semiconductor structure in accordance with some embodiments.

FIG. 28 illustrates a top view of the semiconductor structure of FIG. 19 or FIG. 27 (the top surface 361 and the dielectric layer 36 are not shown in the figure), in which the conductive feature 45 is surrounded by the barrier/liner layer 44, the graphene conductive structure 42 and the metal layer 41.

Figure 29:
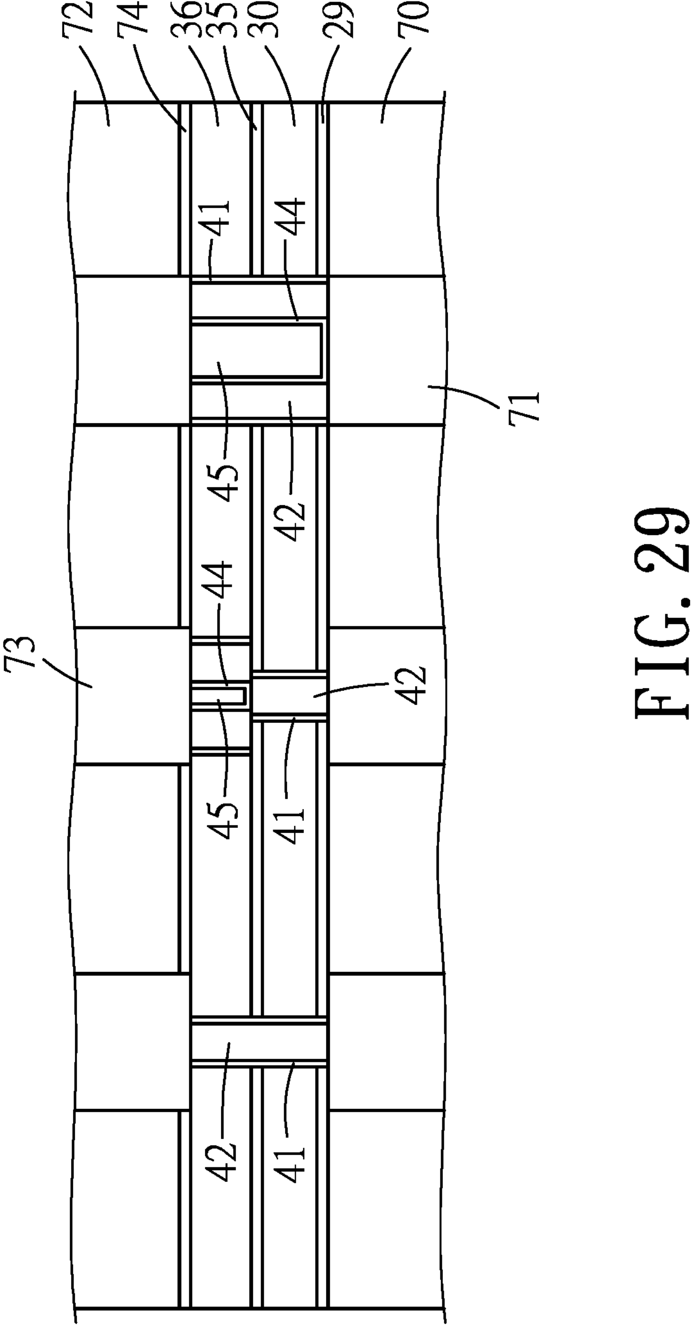
FIGS. 29 and 30 show semiconductor structures in accordance with some embodiments.

In accordance with some embodiments, the abovementioned graphene conductive structure may be used as a M0 level conductive structure (abbreviated as M0) in BEOL interconnection. However, the graphene conductive structure may also be applied to other layers of BEOL interconnection, such as M1 level conductive structure, M2 level conductive structure, etc. In some embodiments, the graphene conductive structure may be applied to a structure for electrical interconnection (e.g., via) in semiconductor devices. In some embodiments, the graphene conductive structure may be a via and may be connected between underlying and overlying connection layers filling trenches, and each of the connection layers may be a graphene conductive structure or other conductive structures made of, e.g., a metal material, such as Cu, Co, W, Ru, Mo, Al, or the like. FIG. 29 shows that the structures shown in FIGS. 6, 19 and 27 are connected to underlying connection layers 71 and overlying connection layers 73. In some embodiments, the underlying connection layers 71 are formed in an underlying dielectric layer 70, and the overlying connection layers 73 are formed in an overlying dielectric layer 72. In some embodiments, an etch stop layer 74 may be formed between the dielectric layer 36 and the overlying dielectric layer 72. In some embodiments, each of the underlying connection layers 71 may be a graphene conductive structure, a metal conductive feature, or a combination thereof. In some embodiments, each of the underlying connection layers 71 may be the structure shown in FIG. 6, 19 or 27. In some embodiments, each of the overlying connection layers 73 may be a graphene conductive structure, a metal conductive feature, or a combination thereof. In some embodiments, each of the overlying connection layers 73 may be the structure shown in FIG. 6, 19 or 27.

Figure 30:
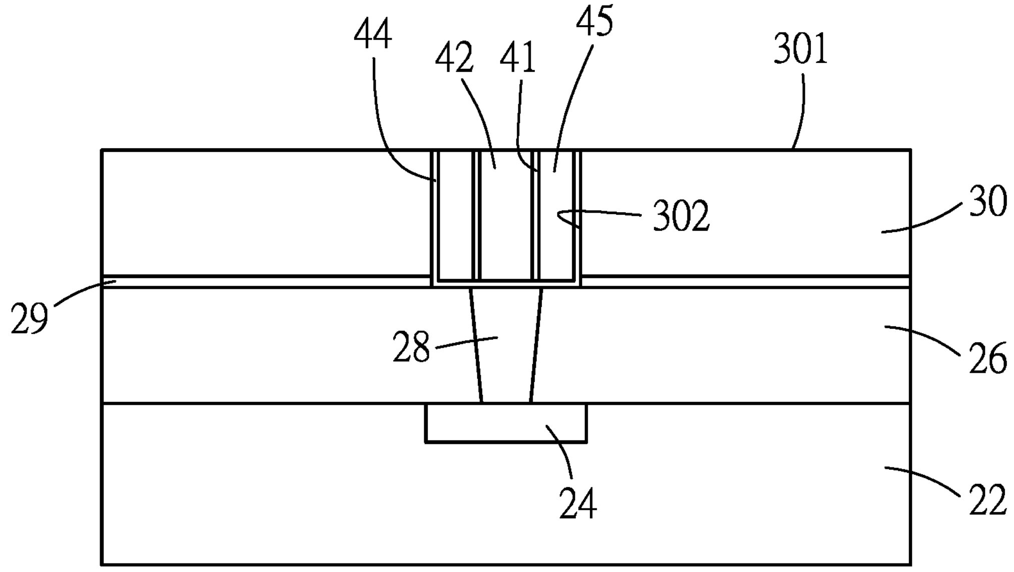

Referring to FIG. 30, in some embodiments in filling the interconnect opening 31 (see FIG. 22), processes 218 to 222 may first be performed to form the barrier/liner layer 44 and the conductive feature 45. Then, processes 210 to 214 may be performed to form the metal layer 41 and the graphene conductive structure 42. In some embodiments, the conductive feature 45 may be made of materials that can serve as catalyst for growing the graphene conductive structure 42, and may include Co, Ni, Ru, Rh, Pd, Re, Cu, Ag, Ir, Pt, Au, Ti, Hf, Ta, W, or combinations thereof, or the like, and the metal layer 41 may be dispensed with.

The embodiments of the present disclosure have some advantageous features. The graphene conductive structure according to this disclosure is directly grown in the interconnect opening from the metal layer on the inner lateral surface and has at least one graphene layer extending in a direction parallel to the inner lateral surface. Such graphene conductive structure can be formed to fill the interconnect opening with small opening (e.g., about 1.5 nm to about 15 nm) or large aspect ratio (e.g., an aspect ratio ranging between about 5 and about 10) without gap-fill issues (e.g., formation of voids in metal filled in the interconnect opening), and the graphene conductive structure and the conductive feature can be formed to fill the interconnect opening with greater opening (e.g., an opening larger than about 15 nm) without having the gap-fill issues. In addition, the graphene conductive structure according to this disclosure has a robust covalent bond structure, which allows the semiconductor structure to be more durable. Moreover, the graphene conductive structure provides a good electric conduction path without suffering from high resistance issues caused by grain boundaries of some metals when the device dimension shrinks. With the patterned dielectric layer and metal layer, the vertical graphene conductive structure can be easily formed into a desirable shape without the need to etch the vertical graphene conductive structure. Furthermore, since doping/intercalating direction is substantially parallel to the extending direction of the graphene layers of the graphene conductive structure, the intercalating material can be easily and efficiently doped or intercalated into the graphene conductive structure so as to improve electrical conductivity of the graphene conductive structure or to adjust the electrical conductivity of the graphene conductive structure to, for example, match that of the conductive feature.

In accordance with some embodiments, a semiconductor structure includes a substrate, a dielectric layer, and a graphene conductive structure. The dielectric layer is disposed on the substrate, and has an inner lateral surface that is perpendicular to the substrate. The graphene conductive structure is formed in the dielectric layer and has at least one graphene layer extending in a direction parallel to the inner lateral surface of the dielectric layer.

In accordance with some embodiments, a semiconductor structure includes a first dielectric layer, a conductive layer, a second dielectric layer, and a graphene conductive structure. The conductive layer is formed in the first dielectric layer, and includes metal, graphene, or a combination thereof. The second dielectric layer is disposed on the first dielectric layer. The graphene conductive structure is formed in the second dielectric layer, has at least one graphene layer extending in a direction perpendicular to the first dielectric layer, and is electrically connected to the conductive layer.

In accordance with some embodiments, a method of making a semiconductor structure includes: forming a dielectric layer on a substrate; forming an interconnect opening in the dielectric layer, the interconnect opening being defined by an inner lateral surface of the dielectric layer that is perpendicular to the substrate; and forming a graphene conductive structure in the interconnect opening, the graphene conductive structure having at least one graphene layer that extends in a direction parallel to the inner lateral surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purpose(s) and/or achieving the same advantage(s) of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a semiconductor structure, comprising:

forming a first dielectric layer on a substrate;

forming an interconnect opening in the first dielectric layer, the interconnect opening being defined by an inner lateral surface of the first dielectric layer that is perpendicular to the substrate;

forming a metal layer on the first dielectric layer and covering the inner lateral surface, the metal layer including Pd, Re, Ag, Ir, Hf, or combinations thereof, and forming a graphene conductive structure in the interconnect opening, the graphene conductive structure having at least one graphene layer extending in a direction parallel to the inner lateral surface, wherein the method further comprises: forming a conductive feature that surrounds the graphene conductive structure, wherein the conductive feature is spaced apart from the graphene conductive structure by the metal layer; and forming a barrier/liner layer which interfaces a lateral surface of the conductive feature and a bottom surface of each of the conductive feature, the metal layer, and the graphene conductive structure.

2. The method as claimed in claim 1, further comprising: after the formation of the metal layer and before the formation of the graphene conductive structure, removing a portion of the metal layer, wherein the graphene conductive structure is formed to be in contact with the metal layer and the metal layer has a single layer configuration.

3. The method as claimed in claim 1, further comprising doping the graphene conductive structure with an intercalating material.

4. The method as claimed in claim 3, wherein the intercalating material is made of tetraethylenepentamine, diethylenetriamine, o-phenylenediamine, 1,2,4-triazole, tetraethylene glycol, phenol, catechol, trifluorobenzene, hexafluorobenzene, $AuCl_5$, Cs—$C_2H_4$, ZnMg, or combinations thereof.

5. The method as claimed in claim 1, wherein the interconnect opening has a width which is larger than 15 nm.

6. The method as claimed in claim 5, wherein the interconnect opening has a height and an aspect ratio of the height to the width is smaller than 5.

7. The method as claimed in claim 1, wherein the metal layer has a thickness ranging from 0.3 nm to 2 nm.

8. The method as claimed in claim 2, wherein the portion of the metal layer is removed by directional dry etching.

9. The method as claimed in claim 8, wherein the directional dry etching is conducted by plasma reactive etching, atomic layer etching, ion-beam etching, e-beam etching, or plasma physical bombardment.

10. The method as claimed in claim 9, wherein the plasma reactive etching is conducted using a reaction gas containing $H_2$, $O_2$, $N_2$, $F_2$, $Cl_2$, $C_xF_y$, $NF_3$, $SiF_4$, $SiCl_4$, or $BCl_3$.

11. The method as claimed in claim 9, wherein the atomic layer etching is conducted using a reaction gas containing $F_2$, $Cl_2$, $Br_2$, $H_2$, HF, HCl, $BCl_3$, $CH_3OH$, HCOOH, acetylacetone, or hexafluoroacetylacetone.

12. The method as claimed in claim 9, wherein the plasma physical bombardment is conducted using a reaction gas containing $H_2$, He, Ar, $N_2$, or Xe.

13. A method of making a semiconductor structure, comprising:

forming a dielectric layer on a substrate;

forming an interconnect opening in the dielectric layer, the interconnect opening being defined by an inner lateral surface of the dielectric layer that is perpendicular to the substrate;

forming a metal layer covering the inner lateral surface, the metal layer including Pd, Re, Ag, Ir, Hf, or combinations thereof; and forming a graphene conductive structure in the interconnect opening such that the graphene conductive structure is formed on and surrounded by the metal layer, the graphene conductive structure including a plurality of graphene layers formed on the metal layer in a layer-by-layer manner and extending in a direction parallel to the inner lateral surface, wherein the method further comprises: forming a conductive feature that surrounds the graphene conductive structure; and forming a barrier/liner layer which interfaces a lateral surface of the conductive feature and a bottom surface of each of the conductive feature, the metal layer, and the graphene conductive structure.

14. The method as claimed in claim 13, wherein the graphene conductive structure is formed by a thermal chemical vapor deposition conducted at a temperature ranging from room temperature to 1000° C.

15. The method as claimed in claim 13, wherein the graphene conductive structure is formed by a plasma-enhanced chemical vapor deposition conducted at a temperature below 400° C.

16. The method as claimed in claim 13, wherein the graphene conductive structure is formed using a precursor including CO, $CH_4$, $C_2H_2$, $CF_4$, $C_2F_6$, $CHF_3$, or benzene.

17. A method of making a semiconductor structure, comprising:

forming a dielectric layer on a substrate;

forming an interconnect opening in the dielectric layer, the interconnect opening being defined by an inner lateral surface of the dielectric layer that is perpendicular to the substrate;

forming a metal layer on the inner lateral surface, the metal layer including Pd, Re, Ag, Ir, Hf, or combinations thereof;

forming a graphene conductive structure in the interconnect opening such that the graphene conductive structure is formed on and surrounded by the metal layer, the graphene conductive structure including a plurality of graphene layers formed on the metal layer in a layer-by-layer manner and extending in a direction parallel to the inner lateral surface; and doping the graphene conductive structure with an intercalating material, wherein the method further comprises:

forming a conductive feature that surrounds the graphene conductive structure, and forming a barrier/liner layer that surrounds the conductive feature, the barrier/liner layer interfacing a lateral surface of the conductive feature and a bottom surface of each of the conductive feature, the metal layer, and the graphene conductive structure.

18. The method as claimed in claim 17, wherein the barrier/liner layer is formed before formation of the conductive feature, the metal layer, and the graphene conductive structure.

19. The method as claimed in claim 17, wherein the intercalating material includes tetraethylenepentamine, diethylenetriamine, o-phenylenediamine, 1,2,4-triazole, tetraethylene glycol, phenol, catechol, trifluorobenzene, hexafluorobenzene, $FeCl_3$, $MoCl_5$, $AuCl_3$, $AlCl_3$, $AsF_5$, $SbF_5$, $HNO_3$, $CuCl_2$, $SbCl_5$, $AuCl_5$, $NiCl_2$, Cs—$C_2H_4$, $NH_3$, ZnMg, $Br_2$, $Cl_2$, $H_2SO_4$, Li, K, Cs, Na, polymethyl methacrylate, polystyrene, or polycaprolactam.

20. The method as claimed in claim 17, wherein the intercalating material is doped at a temperature below 400° C.

* * * * *